US012750972B2

(12) United States Patent
Scott et al.

(10) Patent No.: US 12,750,972 B2
(45) Date of Patent: Sep. 29, 2026

(54) CONFIGURABLE POWER INPUT MODULE FOR COMPUTE RACKS

(71) Applicant: HEWLETT PACKARD ENTERPRISE DEVELOPMENT LP, Spring, TX (US)

(72) Inventors: Michael Dustin Scott, Chippewa Falls, WI (US); Harvey John Lunsman, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 83 days.

(21) Appl. No.: 18/982,140

(22) Filed: Dec. 16, 2024

(65) Prior Publication Data

US 2026/0173301 A1 Jun. 18, 2026

(51) Int. Cl.

| | |
|---|---|
| ***G06F 1/16*** | (2006.01) |
| ***G06F 1/26*** | (2006.01) |
| ***H05K 5/00*** | (2025.01) |
| ***H05K 7/00*** | (2006.01) |
| ***H05K 7/14*** | (2006.01) |

(52) U.S. Cl.
CPC ............. *H05K 7/1492* (2013.01); *G06F 1/26* (2013.01); *H05K 7/1489* (2013.01)

(58) Field of Classification Search
CPC ............ G06F 1/26; G06F 1/263; G06F 1/266; H05K 7/1492; H05K 7/1489; H05K 7/1488; H05K 7/1485
See application file for complete search history.

(56) References Cited

U.S. PATENT DOCUMENTS

| | | | | |
|---|---|---|---|---|
| 7,215,535 | B2 | 5/2007 | Pereira | |
| 8,172,588 | B2 | 5/2012 | Johnson et al. | |
| 8,773,861 | B2 | 7/2014 | Ross et al. | |
| 8,836,175 | B1 * | 9/2014 | Eichelberg | G06F 1/30 307/147 |
| 9,374,926 | B1 * | 6/2016 | Fontana | H05K 7/1492 |
| 10,164,464 | B1 * | 12/2018 | Ross | G06F 1/263 |
| 10,929,290 | B2 | 2/2021 | Nachimuthu et al. | |
| 11,350,546 | B2 | 5/2022 | Chang et al. | |
| 11,966,350 | B2 | 4/2024 | Thakar et al. | |
| 2004/0231875 | A1 * | 11/2004 | Rasmussen | H05K 7/1497 174/50 |
| 2007/0161293 | A1 * | 7/2007 | Ewing | H01H 85/202 439/620.26 |

(Continued)

*Primary Examiner* — Anthony M Haughton
(74) *Attorney, Agent, or Firm* — Jones Burke, PLLC

(57) ABSTRACT

An information processing system comprises a rack capable of accommodating servers and a power distribution circuitry that provides power to the servers. The system further includes a power input module (PIM) placed in the rack that receives input power and converts the input power to output power. The PIM conveys the output power to the power distribution circuitry. The PIM includes power circuitry that converts the input power to the output power, and a housing that houses the power circuitry. The housing has a fixed portion, an input assembly that routes input feeds from outside of the rack into the PIM, and an output assembly comprising output feeds that supply the output power to the power distribution circuitry. The input assembly and the output assembly are movable relative to the fixed portion of the housing.

20 Claims, 16 Drawing Sheets

(56) References Cited

U.S. PATENT DOCUMENTS

| | | | | |
|---|---|---|---|---|
| 2007/0217128 | A1* | 9/2007 | Johnson, Jr. | H05K 7/1492 361/622 |
| 2008/0093927 | A1* | 4/2008 | Ewing | H05K 7/1492 307/23 |
| 2010/0280774 | A1* | 11/2010 | Ewing | G01R 21/10 702/85 |
| 2010/0328849 | A1* | 12/2010 | Ewing | G05F 3/00 361/622 |
| 2014/0239718 | A1* | 8/2014 | Giles | G06F 1/181 307/26 |
| 2016/0079722 | A1* | 3/2016 | Ewing | H01R 25/006 439/638 |
| 2018/0196481 | A1* | 7/2018 | Bersiek | G06F 1/189 |
| 2024/0118326 | A1* | 4/2024 | Ferguson | G01R 22/10 |

* cited by examiner

200

455

CONFIGURABLE POWER INPUT MODULE FOR COMPUTE RACKS

INTRODUCTION

Information processing systems, such as servers and networking devices, are often deployed in racks. The rack comprises a number of support structures (e.g., metal brackets) forming a frame to which the servers or other devices can be mounted. In addition, auxiliary infrastructure may be mounted to the rack to provide services to the other devices in the rack. In particular, a power distribution unit (PDU) may be mounted to the rack to supply power to the other devices. The PDU receives input power from the facility (e.g., datacenter) in which the rack is disposed and distributes that power throughout the rack. The PDU may also perform other functions, such overcurrent and/or overvoltage protection (e.g., fuses), power monitoring, switching, etc. The portion of the PDU which physically receives and electrically interfaces with the facility power lines may be referred to herein as a power input module (PIM). The combination of the rack, the PDU, and any other auxiliary infrastructure mounted to the rack (e.g., liquid cooling infrastructure), may be referred to herein as a rack system.

The PDUs of rack systems typically have redundant components to ensure that the information processing devices mounted to the rack can remain operational in the event of failure of a component of the PDU. In particular, in some systems, the PDU may include two PIMs so that operation may continue even if one PIM fails. Some computing systems may be able to power the entire rack off of one power feed. Other computing systems may be able to supply partial power to the rack on a single feed. In any event, one of the central objectives is to provide redundancy, such that even if a power feed is lost, the devices in the rack may remain functional until it can be serviced to avoid interruptions in operation, even if at reduced power.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings.

DETAILED DESCRIPTION

Figure 1:
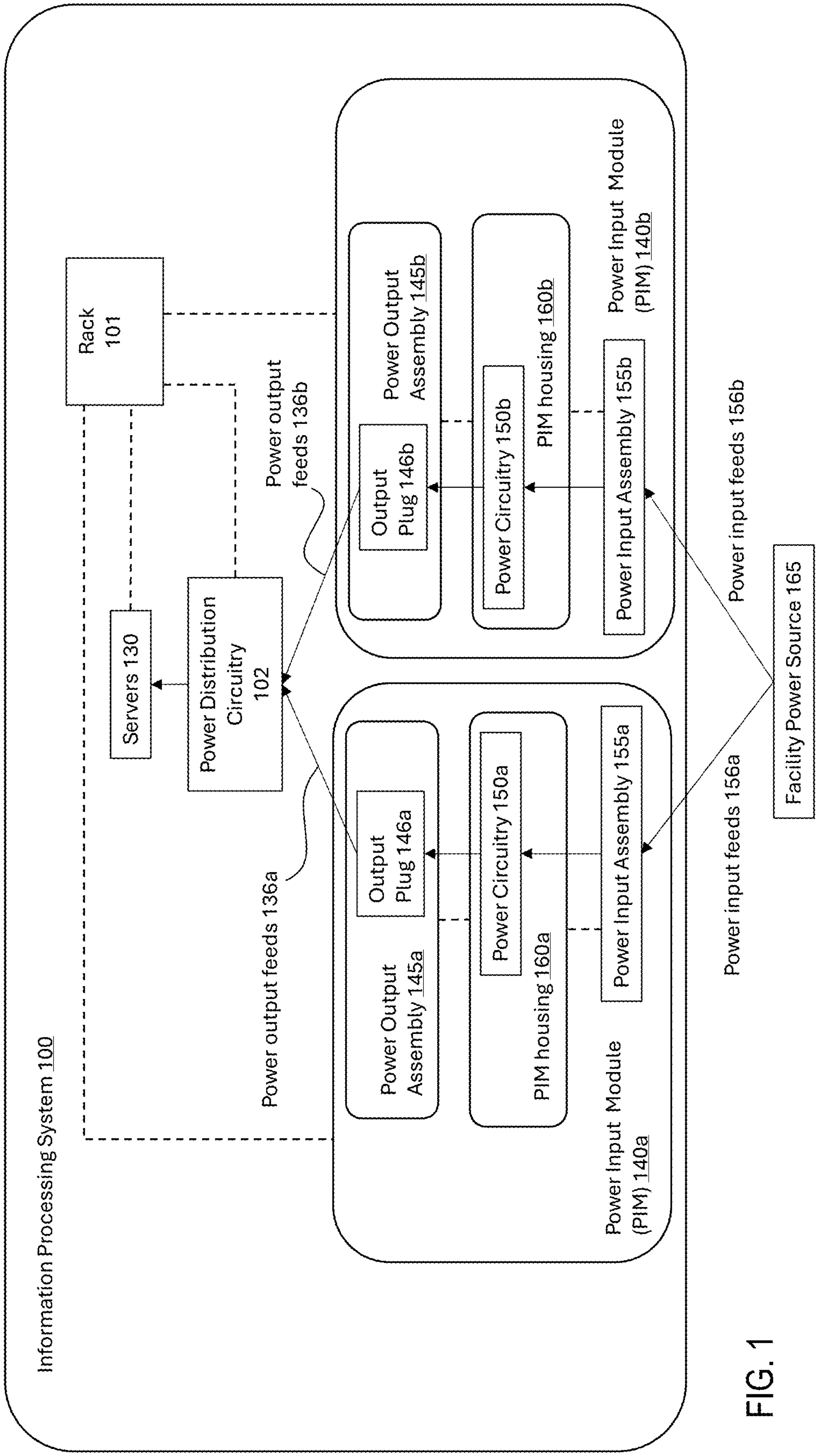
FIG. 1 is a block diagram schematically illustrating an information processing system with one or more power input modules (PIM) installable in multiple installation configurations.

As computing power and density continue to rise, the components which supply power to and through the rack become larger and more difficult to route to and/or position within the rack. For example, in order to carry higher electrical currents, power cords become larger in diameter, making them heavier and less flexible with larger minimum bend radii, and also subject to more stringent electrical safety requirements. These factors contribute to requiring more space and to limiting flexibility in design. Different customer sites in different locations can have different power requirements and electrical safety codes they must comply with, thereby requiring different versions of the rack power systems, as well as different facility layouts that can affect the placement of rack power cords.

For example, rack systems are often deployed on a raised floor or platform, and the facility power input feeds are often routed below this floor. Thus, in such deployments, apertures may be provided in the floors through which the input power feeds may pass to connect with the PIMs of the racks. In other cases, the power feeds may run through a space above the racks, such as through a drop-ceiling, in which case the input power feeds may pass through apertures in the ceiling to connect with the PIMs. The possible locations for the apertures within a given deployment may be limited by the locations of support beams or other obstacles, and thus it may not be possible to ensure consistent alignment of the apertures with the same position on each rack. For example, for a first rack in a row of racks, the aperture may be located near a center of the rack, but for another rack in the row of racks apertures may be located near the sides of the rack with the center being blocked. Consequently, the locations at which the power input feeds can feasibly be disposed may vary from one rack to the next and from one deployment to the next.

Because the locations of the power input feeds can vary, multiple differently configured PIMs may be needed for different deployments and/or for different racks within the same deployment, to accommodate these different power input feed locations. For example, PIMs configured to receive power input feeds from below may be needed for a deployment where power is routed through the floor whereas PIMs configured to receive power input feeds from above may be needed for another deployment where power is routed through a ceiling. As another example, within a given deployment one PIM having a power input opening disposed on one side of the PIM may be needed for a first rack to receive a power input feed disposed near a middle of the rack, while another PIM having a power input opening disposed near the opposite side of the PIM may be needed to receive a power input feed disposed near a side of the rack, and so on. Thus, a manufacturer of the system is often required to design, produce, and warehouse multiple differently configured versions of a PIM. This drives up development, manufacturing, and logistical costs, and also complicates the ordering and installation process. In addition, if a manufacturer and/or a customer desires to keep replacement PIMs on hand in case of failure, they will need to store multiple different versions of replacement units, further increasing costs.

In addition to driving up costs, the need to use multiple different versions of a PIM greatly complicates the process of deploying rack systems. When a customer orders a system, someone has to figure out which types of PIMs, and how many of each, will be needed so that the supply chain teams can procure the correct material in the correct quantities. This generally requires the manufacturer to obtain knowledge of the details of the customer site, including where the power input feeds will be located relative to each rack. This not only takes more time and effort, it also provides an opportunity for a mistake to be made. If such a mistake occurs and the wrong numbers of one or more PIM versions are ordered, this is often not discovered until the installation begins, whereupon new PIMs need to be ordered and shipped, delaying installation. Furthermore, customers sometimes desire to change the installation plan (e.g., rack location or layout) after their initial order, in which case the numbers of each type of PIM which were originally ordered may no longer be correct, as the locations of power input feeds may be different in the new installation plan, thus requiring new PIMs to be ordered and delaying installation. It is also possible for unexpected obstructions to be discovered during installation which may require a change from an expected PIM version to a different PIM version, which again may require a new order of a PIM and delay the installation.

To address these and other issues, disclosed herein are example reconfigurable power input modules (PIM) for a rack system that can be reconfigured post-production between multiple different configuration options, as desired, to support different installation needs, such as differences in customer sites and layout. For example, the example PIMs may include an input assembly to receive power input feeds and an output assembly to export power output feeds, and these may be selectively reconfigurable (post manufacture) to change a relative position at which power input feeds enter the PIM, a pose of the power input feeds at the PIM (e.g., upward extending or downward extending), and/or a relative position at which the power output feeds exit the PIM. The reconfigurability of the PIM can allow a single PIM design to be usable in multiple different installation scenarios which might have previously required different types of PIMs. For example, the same PIM design could be used in both a rack with a centrally located power input feed and a rack with a side located power input feed by reconfiguring the input assembly. Thus, in some cases, just one type of PIM may be needed for installing all of the rack systems in a given deployment and/or across multiple different deployments, greatly reducing costs and complexity, as will be described in more detail below.

A power input module (PIM) with a reconfigurable design simplifies ordering material and reduces the amount of planning required to order the correct material. The flexible arrangement of such a PIM avoids lead-time delays to enable faster delivery to the customer. Instead of having to manufacture and order multiple different versions of the PIM, supply chain personnel can order a set of the same PIMs and then the installation personnel can reconfigure the PIMs as needed on the site and based on the characteristics of the installation interface. Specifically, the PIM can be reconfigured to accommodate a range of options encountered at customer sites, regarding, for example, floor tile stringer locations, top or bottom feed racks, etc. The PIMs can be configured during production with sufficient foreknowledge, or later at the customer site if necessary to accommodate unanticipated changes.

The PIM can provide a single mechanical solution that reuses its own parts for each reconfiguration, thereby avoiding complex material ordering criteria and planning, and, as a result, lowering the cost of materials by only having to order a single version of parts in appropriate quantities. A uniform PIM eliminates the need for creating multiple different versions of sellable units, such as stock keeping unit (SKU) or field replaceable units (FRU), or for determining how many units to order for inventory or for field service and repair. Consequently, engineering time and resources are conserved to design and document different variations, get quotes for different options, and test each design.

The reconfigurable PIM enables better lead-times on material by not having to create and order as many different parts, and by not having to have insight into the details of the customer's layout in order to procure material. The PIMs can be ordered merely by knowing the number of racks of computing the customer intends to buy and can be configured later on as the site layout details are finalized. The adjustable assembly also enables the power cord to be removed from the PIM for ease of installation on site, specifically when dealing with a hardwired cable instead of a pluggable cable. This feature allows for the cables to be sent in advance of the rest of the module assembly if necessary for prepping the customer site and confirming cable lengths.

The PIM includes power circuitry used for conversion of the input power to the output power. The PIM modules can be mounted in sets of two in order to provide redundancy to each other. In one example, the PIMs are installed to be adjacent as a pair, and, accordingly, their installation configuration accounts for such spatial arrangement. Namely, the interface location of the sides of the two PIMs is referred to as the center of the PIM-pair configuration and the opposing ends of each of the PIMs are referred to as the sides of the PIM-pair configuration.

The input feeds from a data center may be inserted through the module's input assembly that includes an opening for the feeds. On the other hand, at the output assembly end of each PIM, the output feeds may be connected to the power rack that includes a busbar, for example. The location of each PIM may be at the top or at the bottom of a rack of a high-performance computer system. Accordingly, the space available to insert/accommodate the input feeds between the tiles of the rack and the PIM may be from above the PIM or from underneath the PIM. The PIMs are configurable to accommodate either of the arrangements/locations relative to the rack. Further, the location of the rack's busbar to which the output feeds are connected may be in the center or on the side(s) of the PIM-pair configuration. Therefore, the same type of PIM may be capable of connecting the output feeds to any location of the busbar in the rack, while allowing the input feeds to be routed through the input assembly.

There are several permutations of where the PIMs can be located in the rack, in combination with where the busbar of the rack is positioned, and the one and the same PIM is capable of adjusting to any permutation of such variables encountered on the site. Hence, instead of having to manufacture and order multiple different versions of the PIM, supply chain personnel can order a set of the same PIMs and adjust installation features on the site and based on the characteristics of the installation interface. The flexibility to adjust to any of the possible permutations can be achieved by modifiable qualities of the input assembly and the output assembly of each PIM.

In particular, the input assembly of the PIM can alternate between two directions in which the input assembly opening faces by rotationally switching the assembly 180 degrees between two positions relative to the PIM housing. The ability of the input assembly to be rotated provides either top access or bottom access for the input feeds into the PIM, depending on the access requirements, i.e., depending on where the PIM is located in the rack, relative to the rack's tiles.

At the same time, the output assembly accommodates a plug that routes the power feeds out of the PIM. The output assembly of the PIM can change the location relative to the fixed portion of the PIM housing to align with the rack's busbar in order to connect the output feeds to the busbar. On the site, the busbar may be installed in the rack either near the center or near the side(s) of the rack. The PIM-pair configuration needs to adjust to whichever busbar installation is encountered.

In one example, the output assembly may be attached to an end of a rotatable back panel of the housing, where the 180 degrees rotation of the back panel results in rotation of its ends. In turn, the rotation of the ends relocates the output assembly from one (e.g., side or center) end of the PIM to the other (e.g., center or side) end of the PIM. The back panel rotation may or may not be necessary depending on whether the output assembly is initially aligned with the busbar. However, if realignment is necessary, the plug of the output assembly may be relocated for the output feeds to reach the busbar and connect.

In another example, the back panel is fixed to the remainder of the PIM housing and does not rotate relative to the rest of the housing components. In such instances, the output assembly is relocated by swapping places with a filler (cover) of the back panel. Specifically, the output assembly is removed and replaced by the cover and subsequently reinserted in the location where the cover previously was.

In the ways discussed above, the overall installation flexibility of the PIM is achieved to properly interface with the rack in a variety of different configurations and based on variable constraints. Such flexibility is provided by modifying the positions of the input assembly and/or output assembly, if and when necessary, relative to the remaining components of the PIM assembly.

Turning now to the figures, various devices, systems, and methods in accordance with aspects of the present disclosure will be described.

FIG. 1 is a block diagram schematically illustrating an information processing system 100 with one or more power input modules (PIM) installable in multiple installation configurations. The system 100 may include a rack 101 configured to removably support and/or house multiple information processing devices in vertically stacked arrangement. The information processing devices may include servers, networking devices, or other information processing equipment. In some examples, the system includes one or more servers 130 mounted to the rack 101. The system 100 also includes a power distribution unit (PDU) to provide power to the devices installed in the rack 101. The PDU may include at least two portions: power input modules (PIM) 140 and power distribution circuitry 102. The PIM 140 receives input power from a facility power source 165 of the facility in which the system 100 is disposed and outputs power to the power distribution circuitry 102, with the power distribution circuitry then distributing that power throughout the rack to the various information processing devices installed therein. The PDU may also perform various operations related to the supply of the power, such as fusing, switching, power monitoring, etc., and these functions may be provided in the PIMs 140, in the power distribution circuitry 102, or in both.

The system 100 may include one or more PIMs 140*a*/140*b* accommodated at the top of the rack or at the bottom of the rack, or at any other location deemed suitable. In one example, there are two PIMs 140*a*/140*b*, hereinafter referred to as a PIM-pair 140*a*/140*b*. The PIM-pair 140*a*/140*b* may ensure redundancy as a result of including two separate modules. In some examples, power distribution circuitry 102 includes a bus bar and the two PIMs 140*a*/140*b* are directly connected to the same bus bar. In some examples, the power distribution circuitry 102 includes two bus bars (e.g., arranged on two different sides of the rack) and the two PIMs 140*a*/140*b* are each connected directly to one of these two separate busbars. In other configurations, the system 100 can include one PIM or three or more PIMs, depending on the desired power conversion.

The facility in which the system 100 is disposed may convey power from a facility power source 165 to the rack 101 via power input feeds 156, such as electrical cables, which are routed into the system 100 via the PIM(s) 140. In FIG. 1, there are two PIMs 140*a*/140*b* illustrated, and thus two corresponding power input feeds 156*a* and 156*b* are also illustrated that are routed into the corresponding modules of the PIM-pair 140*a*/140*b*. In examples with more or fewer PIMs 140, a corresponding number of power inputs feeds 156 may be present. The input feeds 156 that are larger in diameter, heavier, and less flexible are more difficult to route into the rack, especially considering more stringent electrical safety requirements to comply with. These factors contribute to requiring more space and to limiting flexibility in design. Different customer sites in different locations can have different power requirements and electrical safety codes they must comply with, thereby requiring different versions of the rack power systems, as well as different facility layouts that can affect the placement of rack power cords.

Each PIM 140 can be reconfigured to accommodate a range of options encountered at customer sites, regarding, for example, floor tile stringer locations, top or bottom feed racks, etc. The PIM 140 can be configured during production with sufficient foreknowledge, or later at the customer site if desired, e.g., to accommodate unanticipated changes. The PIM 140 can provide a single mechanical solution that reuses its own parts for each reconfiguration, thereby avoiding complex material ordering criteria and planning, and, as a result, lowering the cost of materials by only having to order a single version of parts in appropriate quantities.

Each PIM 140 includes an input assembly 155. In one example, the input assemblies 155*a* and 155*b* are included in the PIM-pair 140*a*/140*b* turned towards the facility power source 165, for the input feeds 156*a*/156*b* to be routed to the system 100. Accordingly, each input assembly 155*a* and 155*b* contains an aperture intended for routing the feeds 156*a/b*.

Each input assembly 155 can be positioned at a side of the corresponding PIM near the center of the rack of the system 100 or near one of the sides of the rack. The positions of the input assembly 155 depend on a variety of constraints, such as the placement relative to the facility power source 165, the location of the apertures in the rack's tiles, the rack's brace, etc. In addition, the input assembly 155 may be detachable from each corresponding PIM housing 160. Further, each input assembly 155 may be rotatable relative to each corresponding PIM housing 160. In one example, the input assembly 155 may be capable of rotatably alternating 180 degrees between two positions respective to the PIM housings 160. Consequent to the rotating the input assembly 155, the apertures intended for routing the feeds 156 may alternate in terms of which direction the apertures are facing.

In one example, the PIM 140 is installed on the bottom of the rack of the system 100, and therefore adjacently above the rack's tiles that include openings for the feeds 156. Therefore, the feeds 156 would be inserted into the rack through the tiles from underneath the rack and, accordingly, into the PIMs from underneath the PIM 140. Consequently, the apertures of the input assemblies 155 would need to face downwards to accommodate the feeds 156. In instances where the existing arrangement of the input assembly 155 faces the apertures in the desired direction, any such input assembly would remain mounted as is. On the other hand, if the existing arrangement of the input assembly 155 faces the apertures upwards, thus hindering or blocking the routing of the feeds 156, the PIM 140 can be reconfigured to rotate one or both of the input assemblies 155, for example 180 degrees. The rotation can be performed in order to point the aperture of the input assembly 155 to properly route the feeds, i.e., in this example in the downwards direction. Any input assembly facing upwards can be detached from the corresponding PIM 140, rotated 180 degrees and reattached to the PIM 140.

In another example, the PIM 140 is installed on the top of the rack of the system 100, and therefore adjacently below the rack's tiles that include openings for the feeds 156. Therefore, the feeds 156 would be inserted into the rack through the tiles from above the rack and, accordingly, into the PIM from above the PIM 140. Consequently, the apertures of the input assembly 155 would need to face upwards to accommodate the feeds 156. In instances where the existing arrangement of the input assembly 155 faces the apertures in the desired direction, any such input assembly would remain mounted as is. On the other hand, if the existing arrangement of the input assembly 155 faces the apertures downwards, thus hindering or blocking the routing of the feeds 156, the PIM 140 can be reconfigured to rotate one or both of the input assemblies 155, for example 180 degrees. The rotation can be performed in order to point the apertures of the input assembly 155 to properly route the feeds, i.e., in this example in the upwards direction. Similar to the above, any input assembly facing downwards can be detached from the corresponding PIM, rotated 180 degrees and reattached to the PIM.

In certain examples, one or both modules of the PIM 140 are installed with the input assembly 155 facing the desired direction, but another constraint, such as for example, the placement of the power output assemblies 145*a* and 145*b* may require rotation of one or both PIMs 140*a*/140*b*. The result of the rotation may be the improper orientation of one or both of the input assemblies 155*a*/155*b*. Subsequently, any of the input assemblies 155*a*/155*b* can be detached and rotated into facing a desired direction relative to the incoming input feeds 156.

As the input feeds 156 are routed into the PIM 140, the feeds 156 are connected to the power circuitry 150*a* and 150*b* of each respective PIM. The power circuitry 150 can be used for power conversion to convey the power sent from the facility power source 165 out of the PIM 140. In one example, there is a power feed collection area (not shown) used to gather the feeds regardless of the required PIM 140 configuration. The feed collection area may located be in the middle section of the PIMs thereby allowing for a geometrical flexibility to route the feeds from the collection area out of the PIMs towards any side or any end of the modules considered desirable.

Moreover, the single mechanical solution of the PIM 140 is additionally versatile by rendering power output assemblies 145*a* and 145*b* capable of being reconfigured, in addition to the above discussed rearrangement of the power input assemblies 155*a* and 155*b*. Such an on-site modification may be accomplished by making each of the output assemblies 145*a* and 145*b* movable relative to the rack 101. As shown in FIG. 1, the output assembly 145 may include corresponding output plugs 146*a* and 146*b* to connect with the power circuitry 150 on one side, and to route the power output feeds 136*a* and 136*b* on the other side of the plugs 146*a*/146*b*. In one example, the plugs 146*a*/146*b* and the output assemblies 145*a/b* that house the plugs 146*a/b* need to convey output feeds 136*a*/136*b* to a rack's busbar. As a result, it may be required that the output assemblies 145*a*/145*b* are located near or adjacent to the busbar.

As mentioned above, the power distribution circuitry 102 may include one or more busbars in the rack 101, and the busbar(s) may be located in the center of the rack, or on one (or both) of the sides of rack of the system 100. In one example, the location of the PIM 140 where the two modules face each other may be aligned with the center of the rack, and the opposite sides of each module of the PIM 140 may be at each side of the rack. At the same time, during the on-site installation of the PIM 140, the busbar(s) may be already mounted in the rack 101 and encountered as is. Therefore, in order to optimize the interface between the PIM 140 and the rack's busbar(s), the PIM 140 may need to be realigned.

In one example, the realignment of the PIM 140 respective to the busbar is performed by relocating the output assembly 145. Each of the output assembly 145 may be located either at a side of the PIM 140 aligned with the center of the rack 101 or with one of the sides of the rack 101. And as mentioned above, each of the output assemblies 145*a*/145*b* are required to be near or adjacent to the busbar in order to convey the output feeds 136 in the most functional and economic manner. In case that one or both of the output assemblies 145*a*/145*b* happen to be mounted at a desired position within the PIM 140, i.e., next to the busbar, any such output assembly 145 would remain in place. However, any output assembly that is offset from the busbar can be repositioned to be aligned with the busbar thus providing on-site installation flexibility to the PIM 140.

The repositioning of the output assembly 145 can be performed in several ways. The PIM housing 160 may include a bottom wall, a top wall, side walls, a front panel and a back panel. Further, PIM housing 160 may include a fixed portion and a movable portion. In one example, the back panel belongs to the movable portion of the PIM housing 160 and in another example, the back panel belongs to the fixed portion of the PIM housings 160.

The output assembly 145 may be reversibly or irreversibly attached to the respective back panels of PIM housing 160. In one example, rotating an entire PIM 180 degrees around an axis perpendicular to the longitudinal axis of the busbar would swap the sides of the back panel of the corresponding PIM. As a result, the output assembly of the rotated PIM relocates from one side of the PIM to the other, relative to the busbar in order to align with the busbar.

In another example, the back panel of a PIM is detached and rotated 180 degrees around the axis perpendicular to the longitudinal axis of the busbar. The result of rotation of the back panel is swapping the sides of the back panel of the corresponding PIM, similar to the above. And the output assembly of the back panel relocates from one side of the back panel to the other, relative to the busbar in order to align with the busbar.

In yet another example, the back panel would include a detachable output assembly on one side, and a detachable filler-cover (not shown) on the other side of the back panel. If necessary to align the output assembly with the busbar of the rack, the output assembly and the filler-cover would be detached to swap places relative to the back panel and the corresponding PIM, and thereby, relative to the rack's busbar.

In one embodiment, each of the PIMs installed in the rack of the information processing system 100 includes a set of one or more input assemblies and output assemblies configured to be modifiable in one or more of the ways discussed above. The input assemblies and the output assemblies can be adjusted (repositioned, rotated, etc.) in coordination with each other, thus producing numerous possible permutations of how each of the PIMs can be rearranged to achieve the desired alignment with the structure that receives the power from the PIMs (e.g., the busbar), while retaining the accessible and orderly arrangement of robust power input feeds 156.

Figure 2:
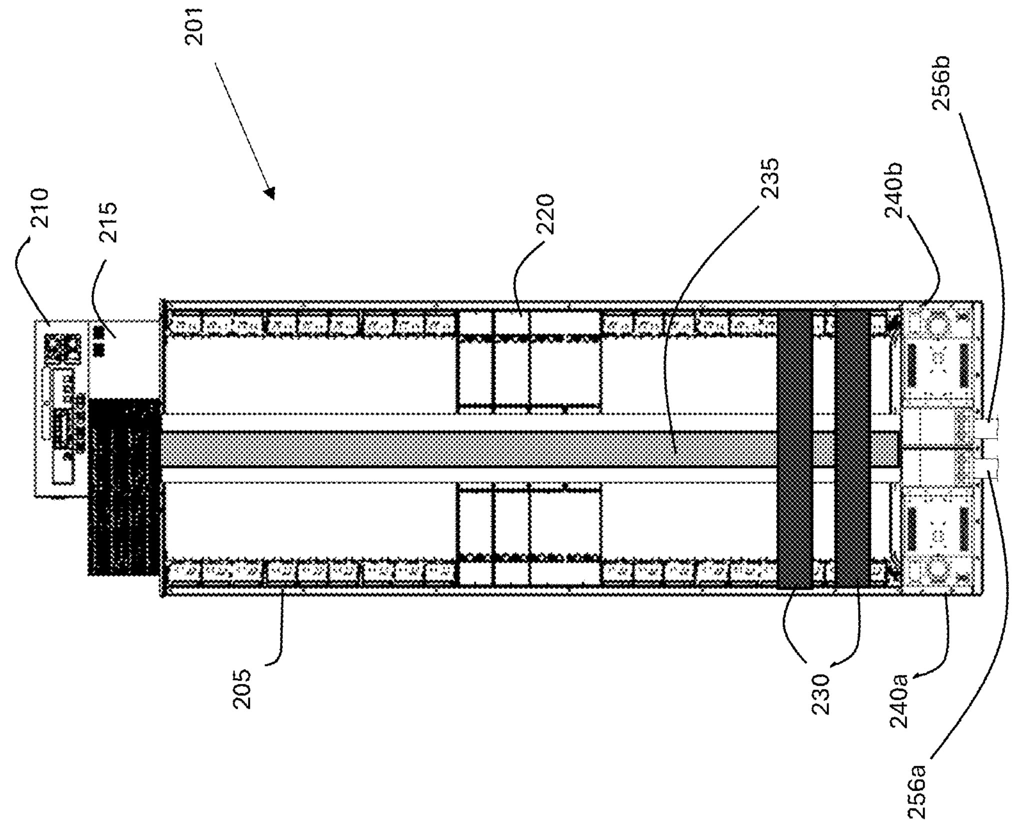
FIG. 2 is a backside view illustrating a rack of an information processing system with one or more power input modules (PIM) installable in multiple installation configurations.

FIG. 2 is a backside view illustrating a rack of an information processing system with one or more power input modules (PIM) installable in multiple installation configurations. The system 200 may include one or more servers 230 that are connected to a switch area 220 to be controlled by the top of rack controller (TORC) 210.

The TORC 210 may be a computer rack management and control device located at the top of a server rack 201 in a data center (not shown). The TORC 210 may act as a central control point for the network traffic between the servers (or compute nodes) 230 within that rack and the rest of the data center network. The TORC 210 may be a switch, a router, or a specialized controller designed to handle network tasks for the rack 201 of the system 200.

The TORC 210 may aggregate the network traffic from the servers 230 within the rack 201. Each of the servers 230 may connect to the switch area 220, which then consolidates these connections into a few uplinks to the larger data center network. In this manner, the TORC 210 helps manage and streamline traffic, reducing the need for every server to connect directly to the core network.

Placing the TORC 210 near the servers 230 in the rack 201 minimizes latency for internal communication within the rack 201. This setup benefits applications that require fast data transfer, like those used in high-performance computing (HPC) or distributed databases. Moreover, by connecting the servers 230 in the rack 201 to a single switch area 220, the need for long cables to connect each server to a distant central switch or router is reduced. Such a setup improves manageability of the cabling system within the rack. The TORC 210 allows network segmentation at the rack level, isolating traffic within the rack 201 from the rest of the data center, which can help secure sensitive workloads and prevent unauthorized access to certain resources. In terms of redundancy, one example setup uses dual TORC switches for redundancy, ensuring that if one switch fails, the other can take over, maintaining network connectivity for the servers 230 in that rack.

Further, the system 200 may include a top of rack power distribution unit TOR PDU 215, which may distribute electrical power to equipment within that rack. While the TORC 210 manages network traffic, a TOR PDU 215 provides and manages power for the networking equipment in the rack 201, such as the servers 230 or storage devices, via a power supply area 225. By centralizing power management, improving access for maintenance, and offering power monitoring and control capabilities, the TOR PDU 215 optimizes power distribution in the data center, reduces downtime, and maintains efficient operations.

One of the purposes of TOR PDU 215 is to distribute electrical power from a primary power source to the devices within the rack 201, such as the servers 230. The TOR PDU 215 may take power from the data center's power supply, via power input modules (PIM) 240*a* and 240*b*. The power from the PIMs 240*a*/240*b* can be transferred via the rack's busbar 235 to the TOR PDU 215 to be delivered to the power supply area 225 and distributed to individual devices within the rack 201.

The TOR PDU 215 may include monitoring features that allow data center operators to track power usage at the outlet, device, or rack level, which helps manage and optimize power usage, enabling better capacity planning and reducing energy costs. Further, the TOR PDU 215 may include remote management capabilities, allowing operators to turn power on or off for specific outlets remotely, which can be useful for resetting equipment or managing power to non-essential devices during maintenance or outages. In certain examples, the TOR PDU 215 includes built-in circuit breakers or fuses to protect equipment from electrical issues like overcurrent or short circuits, and in another example the circuit breakers are also accommodated by the PIMs 240*a* and 240*b*. Accordingly, the TOR PDU 215 and/or the PIMs 240*a*/240*b* ensure that electrical faults in one device do not damage other devices in the rack 201.

For high-density environments, the TOR PDU 215 and/or the PIMs 240*a*/240*b* may balance the electrical load across different circuits, thus avoiding overloads and ensuring that the servers 230 have stable power. Such load balancing can help prevent power failures and optimize power distribution for maximum efficiency. The TOR PDU 215 may include environmental sensors that monitor temperature, humidity, and airflow, which can be used to control operations of a heat exchanger (not shown) in the rack, for example. A feedback loop between the sensors of the TOR PDU 215 and the heat exchanger can help data center operators manage cooling needs more effectively, maintaining optimal operating conditions for the equipment.

There are several benefits of placing the rack's PDU on top of the rack 201. The TOR PDU 215 provides a central point for power distribution within the rack 201, reducing cable clutter and improving the organization of the rack. The TOR PDU 215 may simplify cabling, making it easier to add or remove equipment without significant reconfiguration. Further, as mentioned above, the TOR PDU 215 offers circuit protection and monitoring, which help prevent power-related issues and maintain consistent power to critical equipment.

The system 200 may include one or more PIMs 240*a*/240*b* accommodated at the top of the rack 201 or at the bottom of the rack 201, or at any other location deemed suitable. In one example, there are two PIMs 240*a*/240*b*, hereinafter referred to as a PIM-pair 240*a/b*. The PIM-pair 240*a/b* may ensure redundancy as a result of including two separate modules, or the two modules may provide power to two different sides of the rack 201 in instances where there are two separate busbars. In other configurations, the system 200 can include one PIM or three or more PIMs, depending on the desired power conversion.

The data center may convey power to the rack 201 via power input feeds 256*a* and 256*b* that are routed into the corresponding modules of the PIM-pair 240*a*/240*b*. The input feeds 256*a* and 256*b* that are larger in diameter, heavier, and less flexible are more difficult to route into the rack 201, especially considering more stringent electrical safety requirements to comply with. These factors contribute to requiring more space and to limiting flexibility in design. Different customer sites in different locations can have different power requirements and electrical safety codes they must comply with, thereby requiring different versions of the rack power systems, as well as different facility layouts that can affect the placement of rack power cords.

The PIM-pair 240*a/b* and the input feeds 256*a* and 256*b* can be reconfigured to accommodate a range of options encountered at customer sites, regarding, for example, floor tile stringer locations, top or bottom feed racks, etc. The PIM-pair 240*a/b* can be configured during production with sufficient foreknowledge, or later at the customer site if necessary to accommodate unanticipated changes. The PIM-pair 240*a/b* can provide a single mechanical solution that reuses its own parts for each reconfiguration, thereby avoiding complex material ordering criteria and planning, and, as a result, lowering the cost of materials by only having to order a single version of parts in appropriate quantities.

Figure 3:
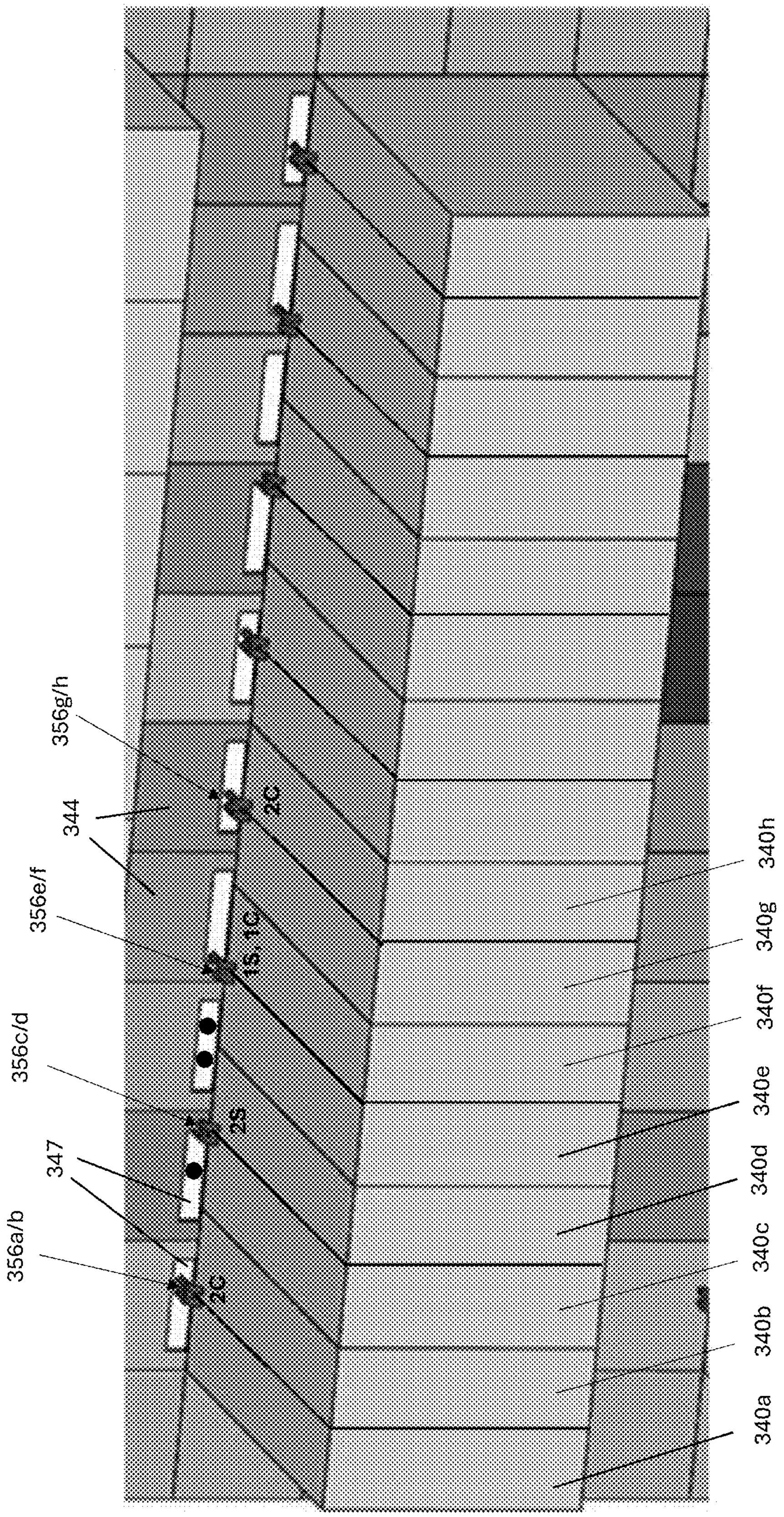
FIG. 3 is a perspective view illustrating an interface between rack tiles and a set of PIMs installable in multiple installation configurations.
Figure 4:
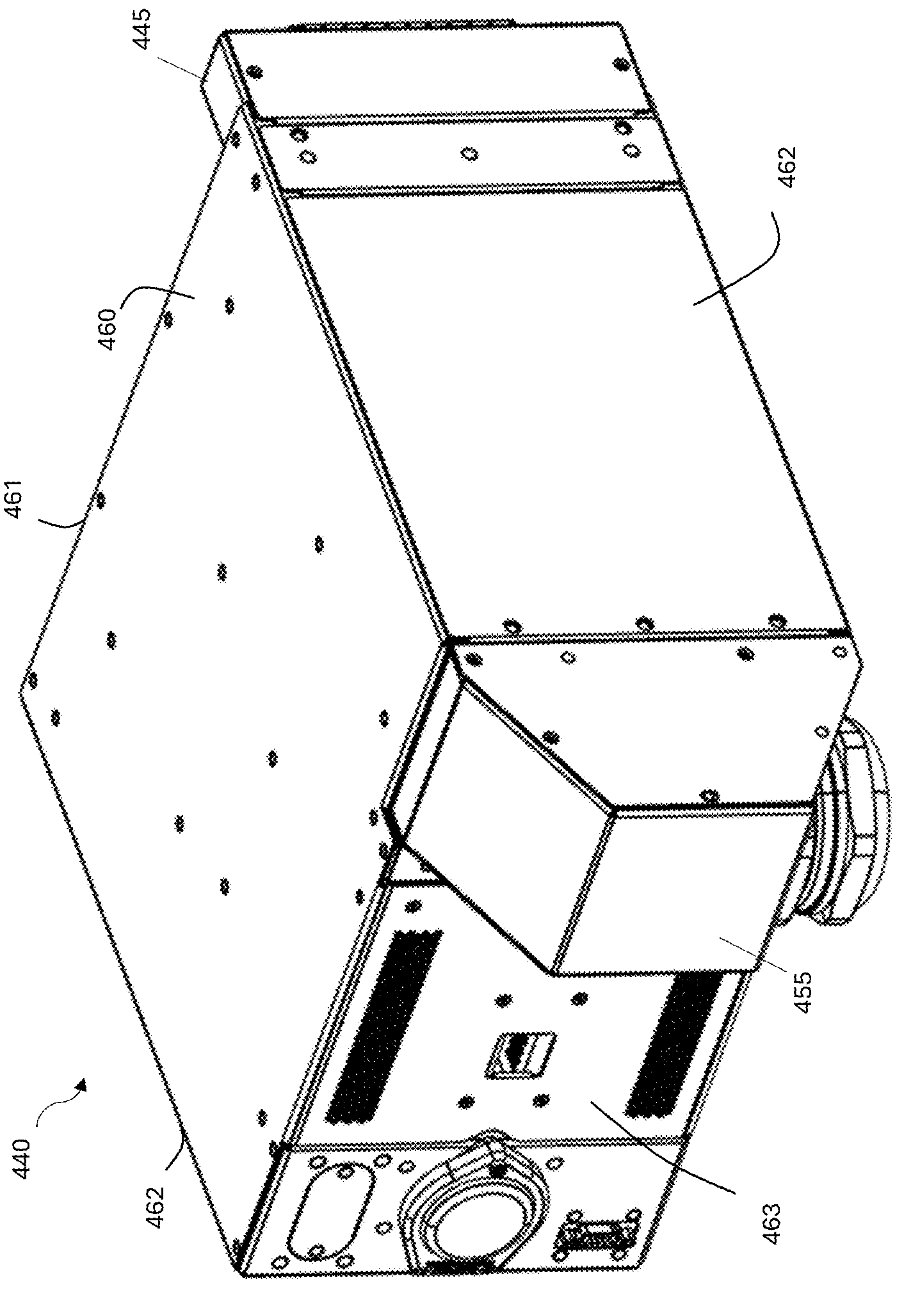
FIG. 4 is a perspective view illustrating a PIM according to one example.

For example, FIG. 3 shows an arrangement where multiple pairs of PIMs, including PIM-pairs 340*a/b*-340*g/h* of uniform dimensions, are installed in a rack with a set of tiles 344. The tiles 344 may be top of rack tiles or bottom of rack tiles and the tiles 344 include corresponding apertures 347 for the power input feeds, such as feeds 356*a*-356*h* to be routed to the PIMs. As a result, the PIMs are positioned adjacent to the tiles 344 and in the vicinity of the apertures 347 that are intended to accommodate the input feeds routed from a data center.

FIG. 3 shows potential problems that the PIMs may encounter when initially interfacing particular tiles in a rack and the solutions according to certain examples, prior to the adjustment. For example, the pattern of tiles may include five tiles in a row, that are as wide as four PIM-pairs. As a result, the dimensions of the PIMs may create an offset with the size of the tiles 344, and, accordingly, the input feeds may not be aligned with the apertures 347 which provide entry ports for the input feeds 356*a*-356*h*.

One example of the solution to the problem identified above will be discussed in reference to the PIM-pair 340*c/d*. The dots illustrate the desired positions of the corresponding input feeds 356*c/d* in comparison with their initial (depicted) location. In this illustrated example, each of the PIMs in the PIM-pair 340*c/d* includes a respective feed or the input feeds 356*c/d*. However, the initial installation of the feeds 356*c/d*, i.e., in the center of the PIM-pair 340*c/d*, aligns the feeds 356*c/d* with the wall of the tiles 344 but not with the tile apertures 347. Such misalignment would cause difficulties in routing the feeds 356*c/d* in and out of the rack and the PIM-pair 340*c/d* as the feeds would be pinched between the PIMs and the tiles. Instead, as shown by the dots depicted in the apertures 347, the feeds 356*c/d* can be relocated to the location of the dots, in order to pass through the apertures 347 into the PIM-pair 340*c/d*.

In one embodiment, this relocation can be performed by rotating each of the PIMs in the PIM-pair 340*c/d* for 180 degrees along an axis perpendicular to the tiles 344. Accordingly, the initial center arrangement of the feeds 356*c/d* would result in the proper side arrangement of the feeds 356*c/d*, as shown by the dots: initial 2C→final 2S. For this reconfiguration and realignment to occur, the required rotation of the PIM-pair 340*c/d* would change orientation of input assemblies of each of the modules in the PIM-pair 340*c/d*. Depending on whether this changed orientation would allow for the feeds 356*c/d* to enter the PIMs unobstructed, one or both of the input assemblies would have to be realigned, as will be discussed with respect to FIGS. 5A-C.

Notably, in the example of FIG. 3, the PIM-pair 340*a/b* is initially installed in the 2C configuration, where the feeds 356*a/b* adequately pass through the tile apertures 347. As a result, neither of the modules of the PIM-pair 340*a/b* would need to be moved/rotated for realignment, similar to the PIM-pair 340*g/h*: initial 2C→final 2C.

However, the initial configuration of the PIM-pair 340*e/f* would pinch the feed 356*e*, while the feed 356*f* would just pass through the tile aperture 347. Hence, the PIM 340*e* would be rotated 180 degrees along an axis perpendicular to the tiles 344, and the PIM 340*f* would remain in place. Consequently, the initial center arrangement of the feed 356*e* would be changed to the proper side arrangement of the feed 356*e*, as shown by the dot, and the feed 356*f* would stay positioned in the center: initial 2C→final 1S, 1C.

Each PIM can provide a single mechanical solution that reuses its own parts for each reconfiguration, thereby avoiding complex material ordering criteria and planning, and, as a result, lowering the cost of materials by only having to order a single version of parts in appropriate quantities. In one example, shown in FIGS. 4-13, the reconfiguration of a PIM 440 is accomplished by attaching a power input assembly 455 to the PIM 440. In one example, the input assembly 455 passes the input feeds 456 to be routed to the PIM 440. Accordingly, the input assembly 455 contains an aperture 457 for routing the feeds 456.

Figure 5:
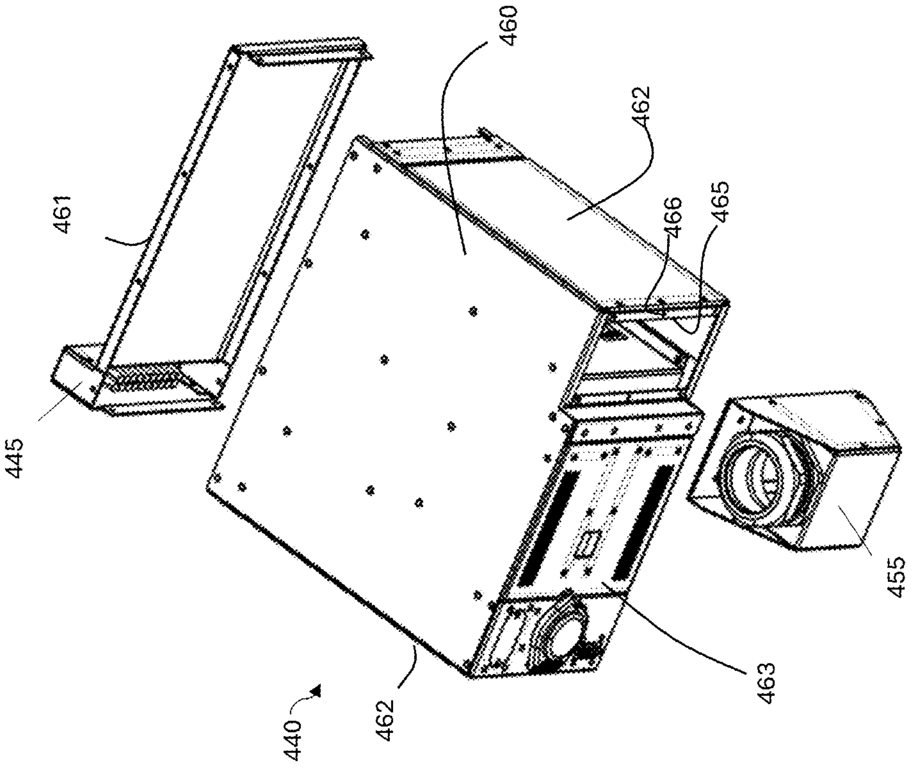
FIG. 5 is an exploded view illustrating a PIM according to one example.
Figure 7:
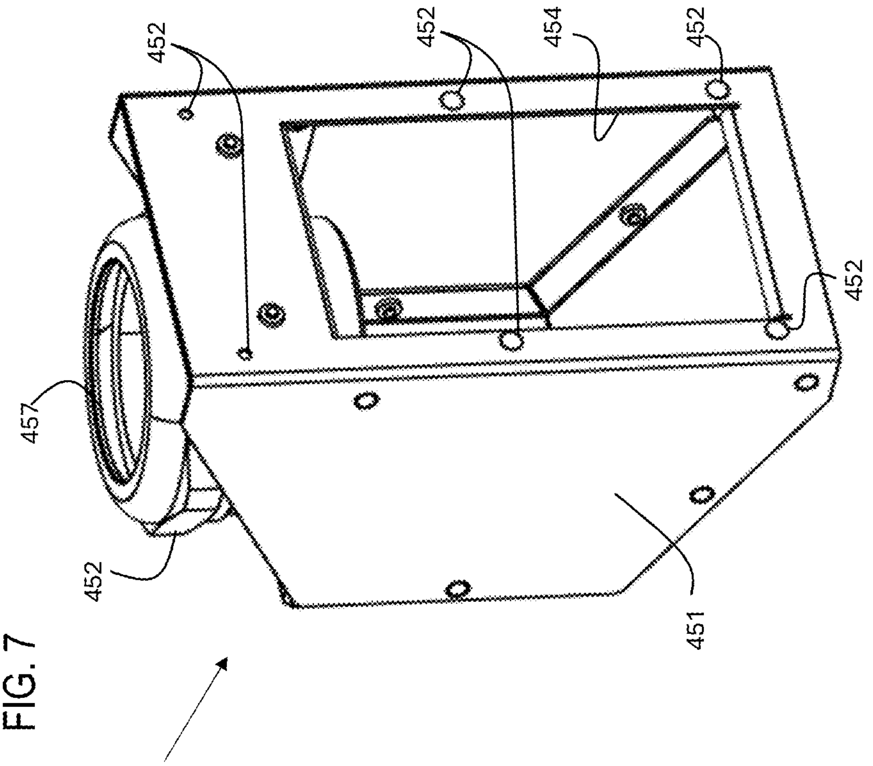
FIGS. 6 and 7 are perspective views illustrating a power input assembly according to one example.
Figure 6:
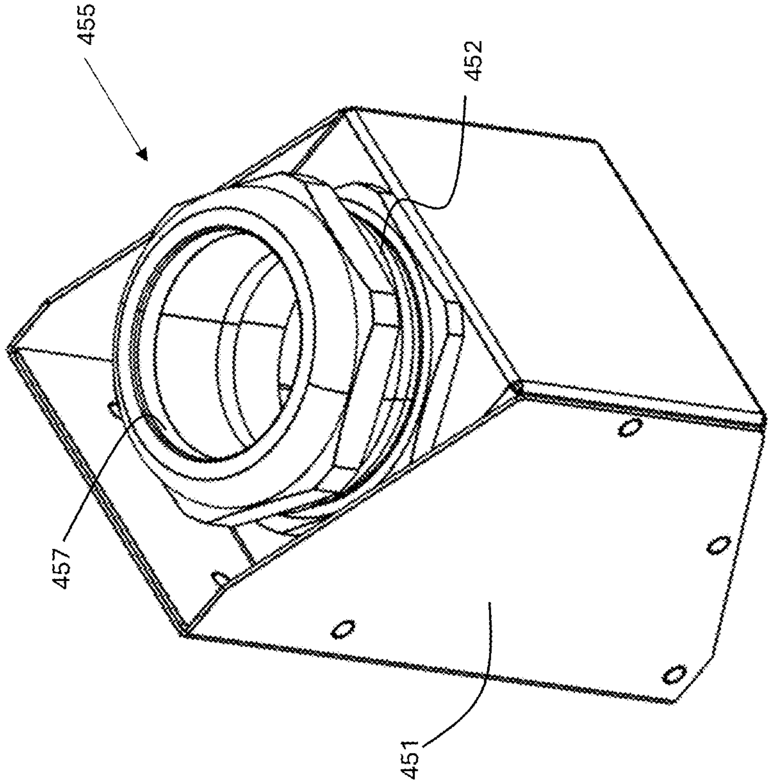
Figures 10, 11:
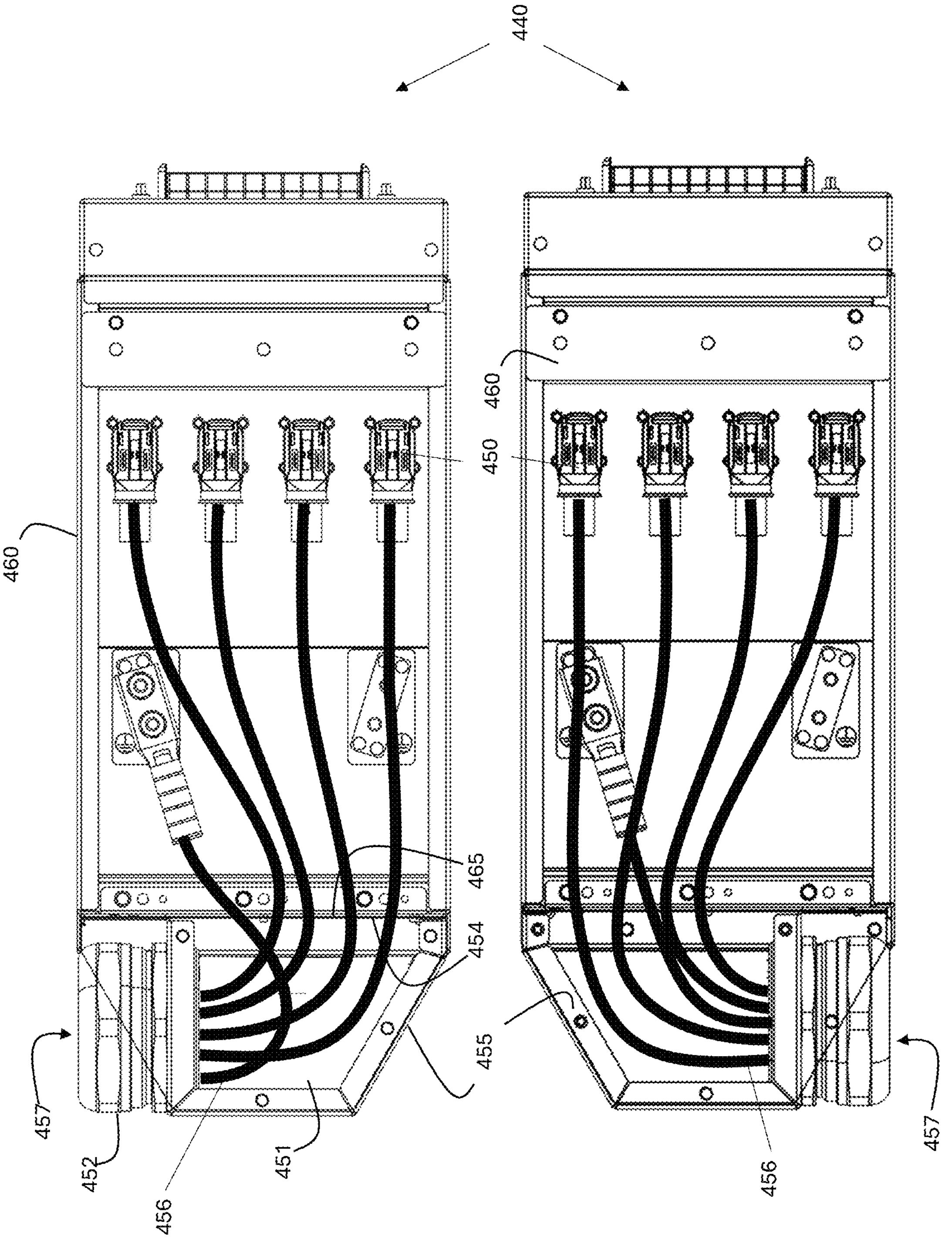
FIGS. 10 and 11 are side views illustrating components of a PIM installable in multiple installation configurations.

In the example illustrated in FIGS. 6 and 7, the input assembly 455 comprises an input housing 451 and an input tube 452 coupled to the input housing 452. The input tube 452 comprises the aperture 457 through which feeds 456 can be routed, as shown in FIG. 10. The input housing 451 comprises a first opening 454 as shown in FIG. 7, and when the input assembly 455 is coupled to the PIM housing 460 the first opening 454 is aligned with an opening 465 in the front panel 463 of the PIM housing 460, shown in FIG. 5. This allows the input feeds 456 to exit the input housing 421 and enter the PIM housing 460 via the first opening 454 and the opening 465, as shown in FIG. 10. As shown in FIG. 7, the input housing 451 comprises fastener holes 452 around the first opening 454 through which fasteners may extend to fasten the input housing 451 to the PIM housing. As shown in FIG. 5, the PIM housing 460 has corresponding fastener openings 466 (only one is labeled) arranged around the opening 465 to receive these same fasteners. The fasteners may be removable in nature, such as screws or bolts, allowing the input housing 451 to be removed from PIM housing 460 if desired, such as to reverse the orientation of the input assembly 455.

Figure 13:
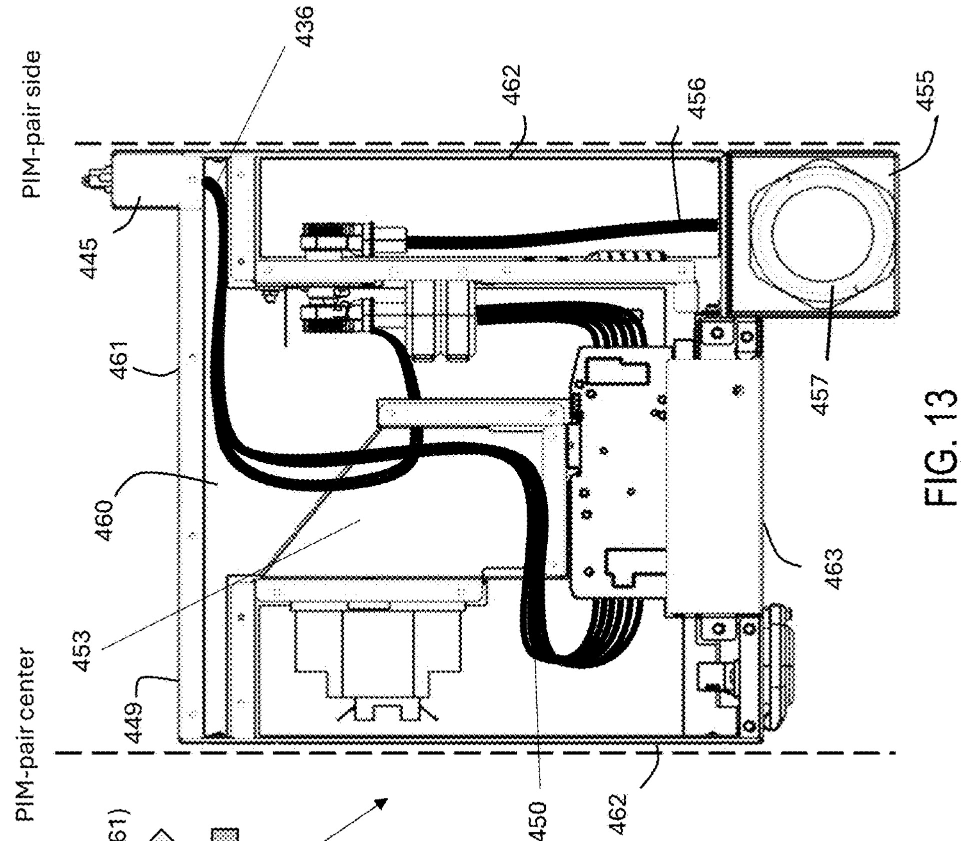
FIGS. 12 and 13 are top views illustrating components of a PIM installable in multiple installation configurations.
Figure 12:
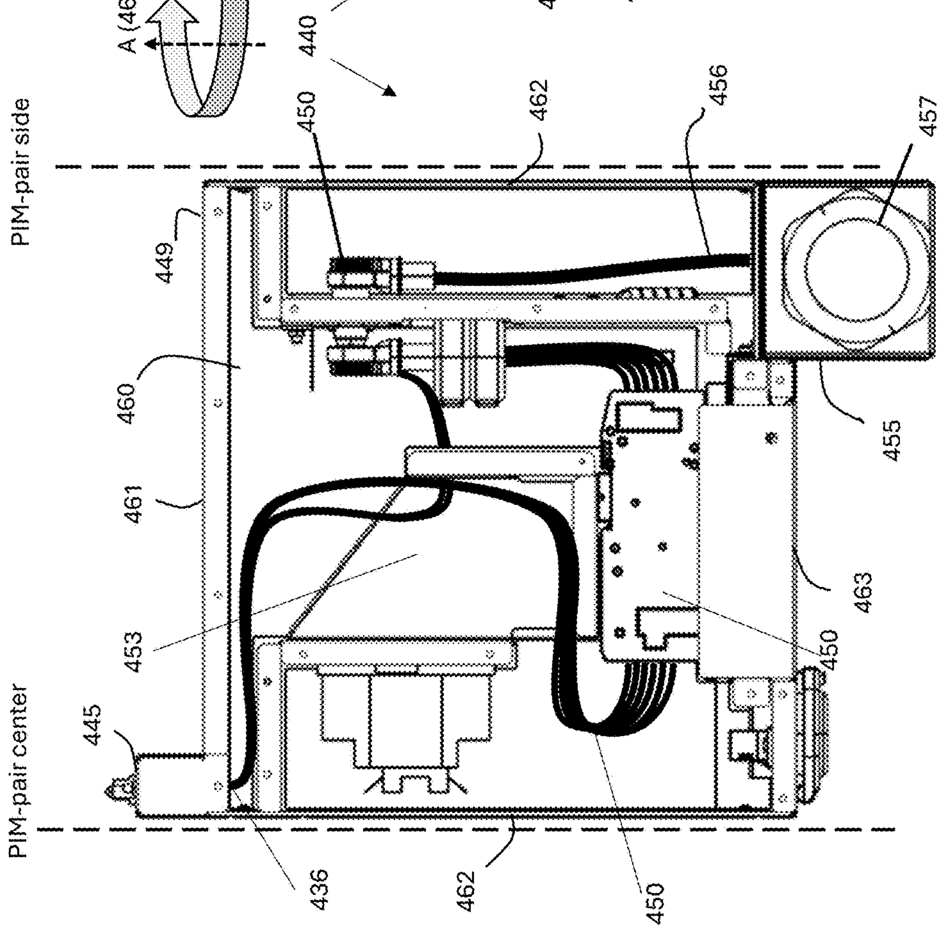
Figure 14A:
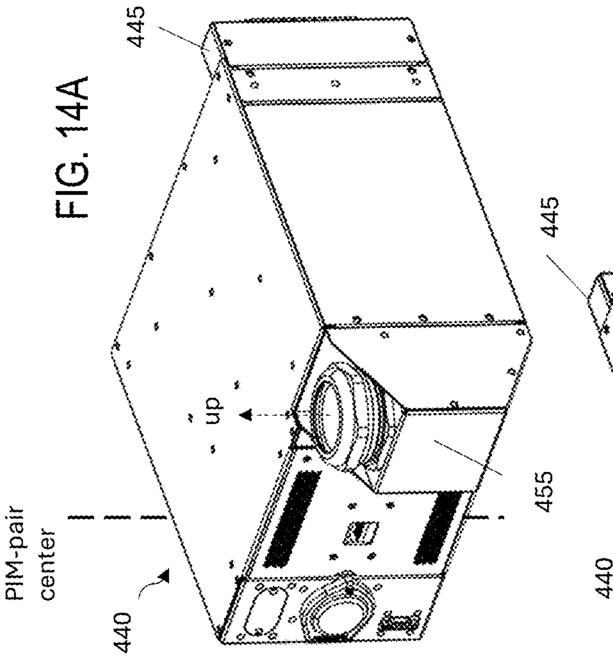
FIGS. 14A-14D are perspective views illustrating a PIM installable in multiple installation configurations.
Figure 14B:
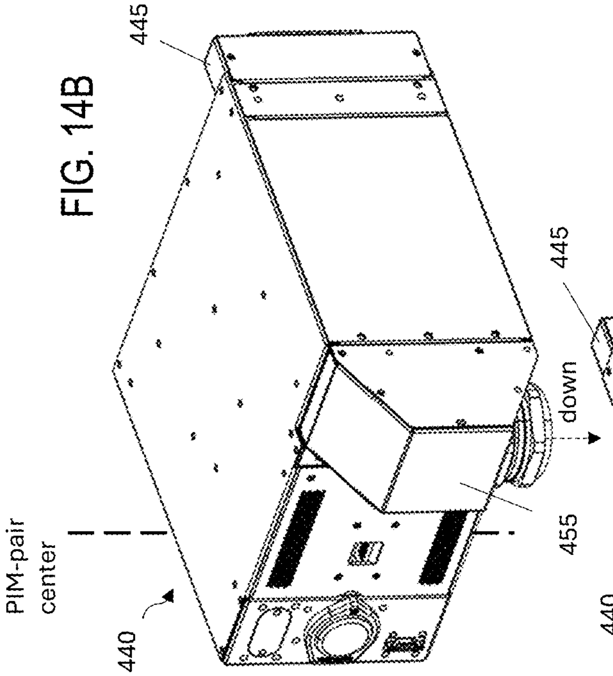
Figure 14C:
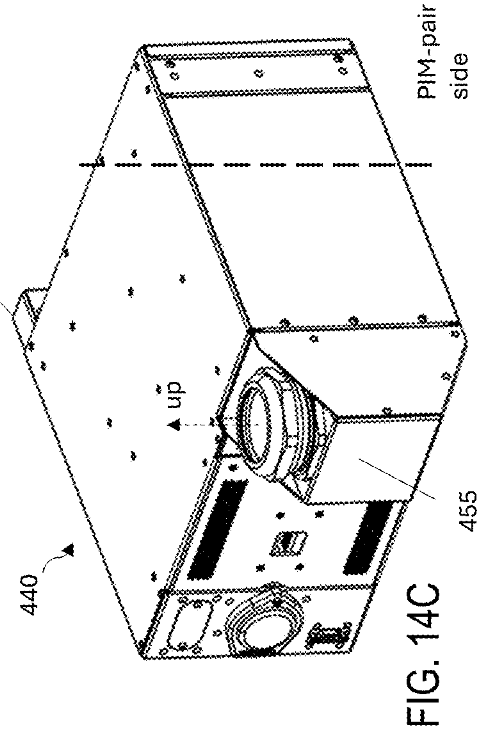
Figure 14D:
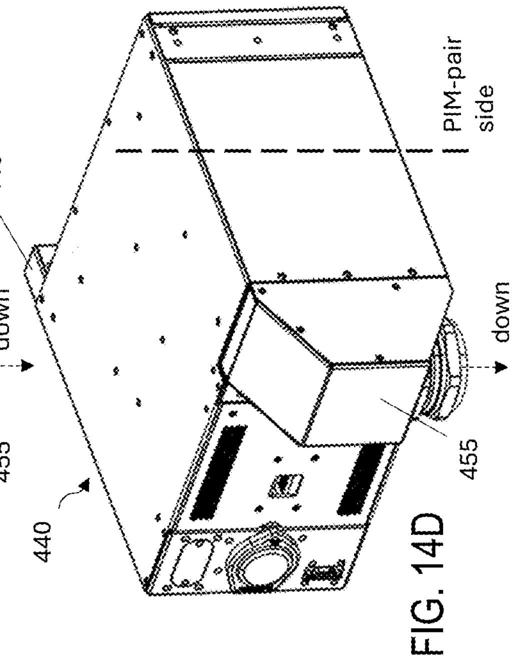

The input assembly 455 can be positioned at an end of the corresponding PIM near the center of the rack of the system (at the PIM-pair center) or near one of the sides of the rack, as shown in FIGS. 12 and 13 (at the PIM-pair side). As mentioned above, the side and the center position within an individual PIM may be a function of the PIM's relative position in a PIM-pair. For example, the left end of the right-hand side PIM in a pair of modules is considered a center position within the PIM, and vice versa, the right end of the left-hand side PIM in a pair of modules is also considered a center position of that particular PIM, as depicted in FIGS. 16-19. The position within each individual PIM opposite to the PIM's center position is referred to as a side position. The side positions of each PIM may be aligned with each of the sides of the rack, and the center position of each PIM may be aligned with the center of the rack.

The positions of the input assembly 455 depend on a variety of constraints, such as the placement relative to the data center, the location of the apertures in the rack's tiles, the rack's brace, etc. In addition, the input assembly 455 may be detachable from a PIM's housing 460. The PIM's housing 460 may house the power circuitry 450, including a variety of cables, feeds, fuses, circuit breakers, etc. The PIM's housing 460 may further include a central compartment 453, where the internal feeds are gathered prior to routing the internal feeds out of the PIM 440. The PIM's housing 460 may include a fixed part and a movable part. Some of the components of the housing 460 can be a back panel 461, side walls 462, a front panel 463, a top cover (now shown) and a bottom cover (not shown). The back panel 461 may include a power output assembly 445. The power output assembly 445 can be reversibly or irreversibly attachable to the back panel 461.

In one embodiment, the fixed part of the PIM housing 460 may include the back panel 461, the side walls 462, the front panel 463, the top cover (now shown) and the bottom cover. In another embodiment, the fixed part of the PIM housing 460 may include the side walls 462, the front panel 463, the top cover (now shown) and the bottom cover, while the movable part of the housing 460 may include the back panel 461.

FIGS. 6 and 7 are a perspective view illustrating a power input assembly 455 detached from a PIM. FIG. 10 is a side view illustrating components of the PIM 440 installable in one installation configuration. FIG. 11 is a side view illustrating components of the PIM installable in another installation configuration, where the input assembly 455 is rotated 180 degrees relative to the installation shown in FIG. 10. In one example, the assembly 455 includes flanges (not shown) used for guiding the input assembly 455 onto corresponding grooves in the PIM housing 460.

Turning back to FIG. 2, the PIM-pair 240*a*/240*b* may be installed on the bottom of the rack 201, and therefore adjacently above the rack's tiles that include openings for the feeds 256*a*/256*b*. Therefore, the feeds 256*a*/256*b* would be inserted into the rack 201 through the tiles from underneath the rack and, accordingly, into the PIMs from underneath the PIM 240. Consequently, the apertures of the input assemblies would need to face downwards to accommodate the feeds 256*a*/256*b* (See FIG. 11). In instances where the existing arrangement of the input assemblies faces the apertures in the desired direction, any such input assembly would remain mounted as is. On the other hand, if the existing arrangement of the input assemblies faces the apertures upwards (see FIG. 10), thus hindering or blocking the routing of the feeds 256*a*/256*b*, the PIM 240 can be reconfigured to rotate one or both of the input assemblies, for example 180 degrees. The rotation can be performed in order to point the apertures of the input assemblies to properly route the feeds, i.e., in this example in the downwards direction. Any input assembly facing upwards can be detached from the corresponding PIM, rotated 180 degrees and reattached to the PIM, which would correspond to an exemplary rotation of the input assembly 455 from a position shown in FIG. 10 to a position shown in FIG. 11.

In another example (not shown), the PIM-pair 240*a*/240*b* is installed on the top of the rack 201, and therefore adjacently below the rack's tiles that include openings for the feeds 256*a*/256*b*. Therefore, the feeds 256*a*/256*b* would be inserted into the rack 201 through the tiles from above the rack and, accordingly, into the PIMs from above the PIM-pair 240*a*/240*b*. Consequently, the apertures of the input assemblies would need to face upwards to accommodate the feeds 256*a*/256*b* (See FIG. 10). In instances where the existing arrangement of the input assemblies faces the apertures in the desired direction, any such input assembly would remain mounted as is. On the other hand, if the existing arrangement of the input assemblies faces the apertures downwards (see FIG. 11), thus hindering or blocking the routing of the feeds 256*a*/256*b*, the PIM-pair 240*a*/240*b* can be reconfigured to rotate one or both of the input assemblies, for example 180 degrees. The rotation can be performed in order to point the apertures of the input assemblies to properly route the feeds, i.e., in this example in the upwards direction. Similar to the above, any input assembly facing downwards can be detached from the corresponding PIM, rotated 180 degrees and reattached to the PIM, which would correspond to an exemplary rotation of the input assembly 455 from a position shown in FIG. 11 to a position shown in FIG. 10.

In certain examples, one or both modules of the PIM-pair 240*a*/240*b* are installed with the input assemblies facing the desired direction, but another constraint, such as for example, the placement of the power output assemblies may require rotation of one or both PIMs. The result of the rotation may be the improper orientation of one or both of the input assemblies. Subsequently, any of the input assemblies can be detached and rotated into facing a desired direction relative to the incoming input feeds 256*a*/256*b*.

Further regarding FIGS. 12 and 13, as the input feeds 456 are routed into the PIM 440, the feeds 456 are connected to the power circuitry 450 of the PIM 440. The power circuitry 450 can be used for power conversion to convey the power sent from the data center out of the PIM 440. In one example, there is a central compartment 453 of the PIM housing 460 used to gather the feeds regardless of the required PIM configuration. The feed collection area may located be in the middle section of the PIM 440 thereby allowing for a geometrical flexibility to route the feeds from the collection area out of the PIMs towards any side or any end of the modules considered desirable.

Moreover, the single mechanical solution of the PIM 440 is additionally versatile by rendering power output assemblies 445 capable of being reconfigured, in addition to the above discussed rearrangement of the power input assembly 455. Such an on-site modification may be accomplished by making each of the output assemblies 445 movable relative to the rack. The output assembly 445 may accommodate an output plug 446 electrically connected with the power circuitry 450 on one side and configured to electrically connect with a complementary connector of the power distribution circuitry (e.g., bus bar) of the rack. In this example, the power output feeds 436 terminate into pins in the output plug and are thus electrically connected to the rack power distribution circuitry via the plug. In this manner, the output assembly 445 and the output plug 446 housed therein export or convey (i.e., electrically connect) the output feeds 436 to the rack's busbar. As a result, it may be beneficial for the output assemblies 445 to be located near or adjacent to the busbar.

There may be one or more busbar in the rack, and the busbar(s) may be located in the center of the rack (see FIG. 2), or on one (or both) of the sides of rack. In one example, the location of the PIM-pair where the two modules face each other may be aligned with the center of the rack (PIM-pair center), and the opposite sides of each module of the PIM-pair may be at each side of the rack (PIM-pair side). At the same time, during the on-site installation of the PIM 440, the busbar(s) may be already mounted in the rack and encountered as is. Therefore, in order to optimize the interface between the PIM-pair and the rack's busbar(s), each PIM 440 may need to be realigned with the busbar(s).

In one example, the realignment of the PIM 440 respective to the busbar is performed by relocating the output assembly 445. The output assembly 445 may be located either on a PIM-pair side, as shown in FIGS. 12 and 13. And as mentioned above, the output assembly 445 is required to be near or adjacent to the busbar in order to convey the output feeds 436 in the most functional and economic manner. In case that the output assembly 445 is initially mounted at a desired position relative to the rack, i.e., next to the busbar, the output assembly 445 would remain in place. However, any output assembly that is offset from the busbar can be repositioned to be aligned with the busbar thus providing on-site installation flexibility to the PIM 440.

The repositioning of the output assembly 445 can be performed in several ways. An exemplary configuration resulting from the repositioning of the output assembly from the PIM-pair side to the PIM-pair center is shown in FIG. 12. In this example, the initial location of the output assembly 445 in FIG. 13 is misaligned with the rack's busbar, which is located in the center of the rack, i.e., on the PIM-pair center side of the PIM 440. The output feeds 436 are collected in the central compartment 453 of the PIM housing 460, thereby arranged to be routed towards whichever the desired portion of the PIM housing 460 is, and out of the housing 460, based on the location of the busbar.

The output assembly 445 may be reversibly or irreversibly attached to the back panel 461 of PIM housing 460. In one example, rotating an entire PIM 440 180 degrees around an axis parallel to the side walls 462 of the housing 460 would swap the sides of the PIM 440. As a result, the output assembly 445 of the PIM 440 relocates from one side of the PIM to the other, relative to the busbar in order to align with the busbar.

Figure 8:
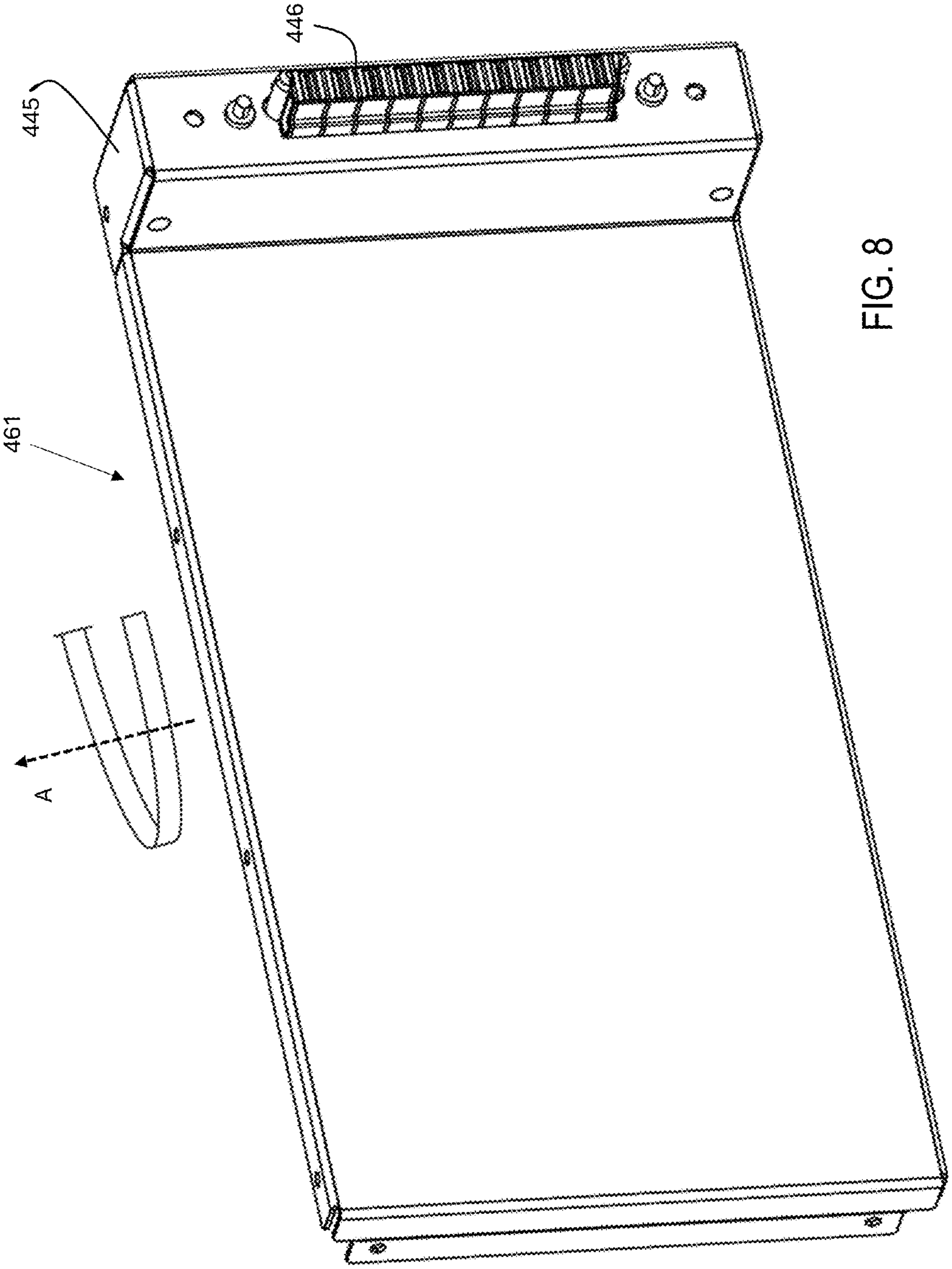
FIGS. 8 and 9 are perspective views illustrating a back panel with a power output assembly according to one example.
Figure 9:
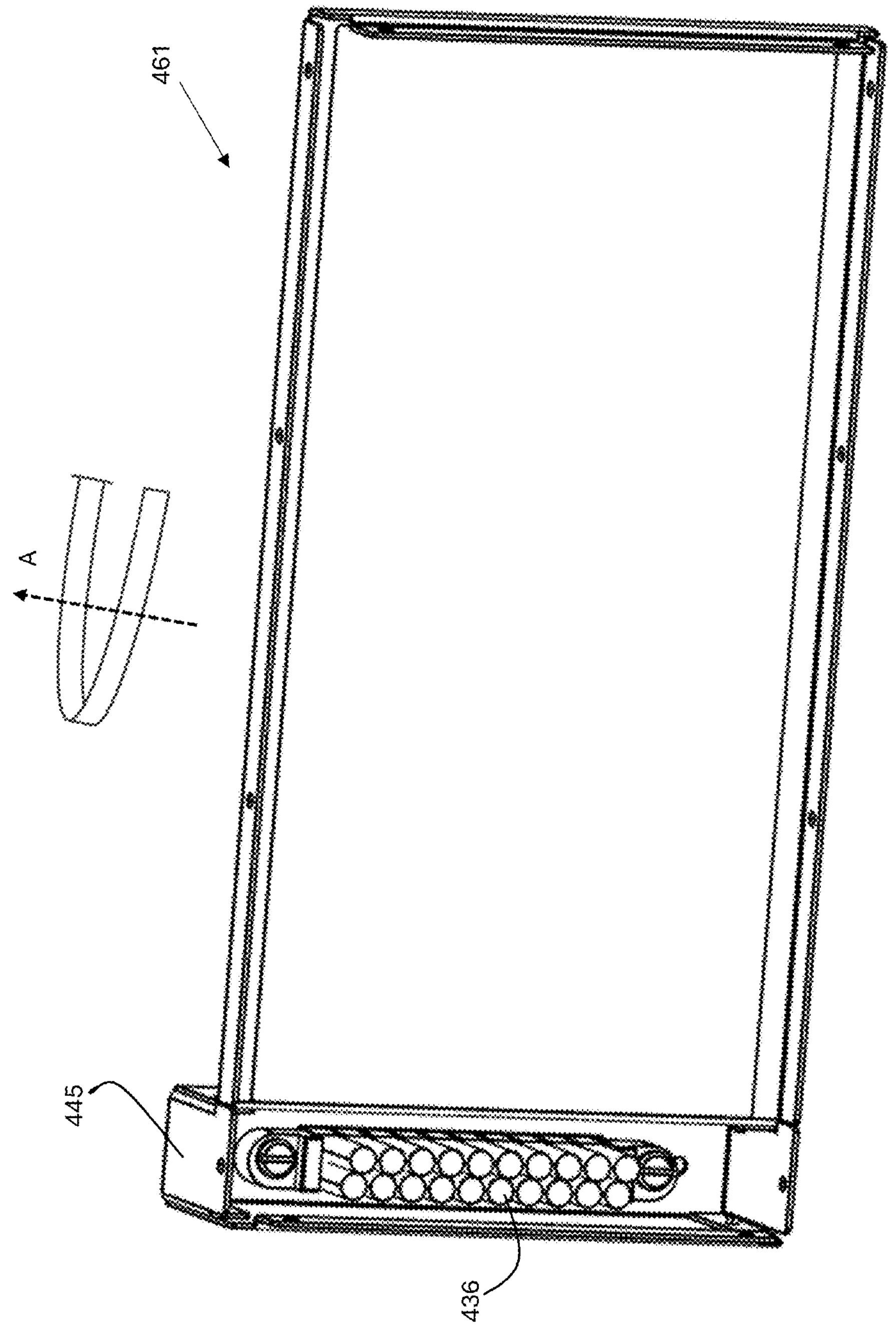

In another example reconfiguration, shown in FIGS. 12 and 13, the back panel 461 of a PIM 440 is detached and rotated 180 degrees around the A axis parallel to the side walls 462. FIGS. 8 and 9 are perspective views illustrating a back panel 461 with a power output assembly 445 detached from a PIM. In this example, the busbar is mounted at the center of the rack. The result of rotation of the back panel 461 is swapping the sides of the back panel 461 from a position show in FIG. 13 to the position shown in FIG. 12. And the output assembly 445 of the rotated back panel 461 relocates from the PIM-pair side of the PIM 440 to the PIM-pair center, in order to align with the busbar. In the alternative, when the initial location of the output assembly 445 is on the PIM-pair center side as shown in FIG. 12, but the busbar is on one of the sides of the rack and not at the center of the rack, the rotation of the back panel 461 around the A axis in the opposite direction is desirable. Accordingly, such reconfiguration of the PIM 440 from FIG. 12 to FIG. 13 places the output assembly 445 at the PIM-pair side, where the busbar is.

In yet another example, the back panel 461 includes a detachable output assembly 445 on one side, and a detachable filler-cover 449 on the other side of the back panel 461. If necessary to align the output assembly 445 with the busbar of the rack, the output assembly 445 and the filler-cover 449 would be detached to swap places relative to the back panel 461 and the PIM housing 461, and thereby, relative to the rack's busbar.

In one embodiment, each of the PIMs installed in the rack of the information processing system includes a set of one or more input assemblies and output assemblies configured to be modifiable in one or more of the ways discussed above. The input assemblies and the output assemblies can be adjusted (repositioned, rotated, etc.) in coordination with each other, thus producing numerous possible permutations of how each of the PIMs can be rearranged to achieve the desired alignment with the structure that receives the power from the PIMs (e.g., the busbar), while retaining the accessible and orderly arrangement of robust power input feeds.

FIGS. 14A-14D are perspective views illustrating a PIM installable in multiple installation configurations and FIGS. 15A-15D are top views illustrating a PIM installable in multiple installation configurations.

Figures 15A, 15B, 15C, 15D:
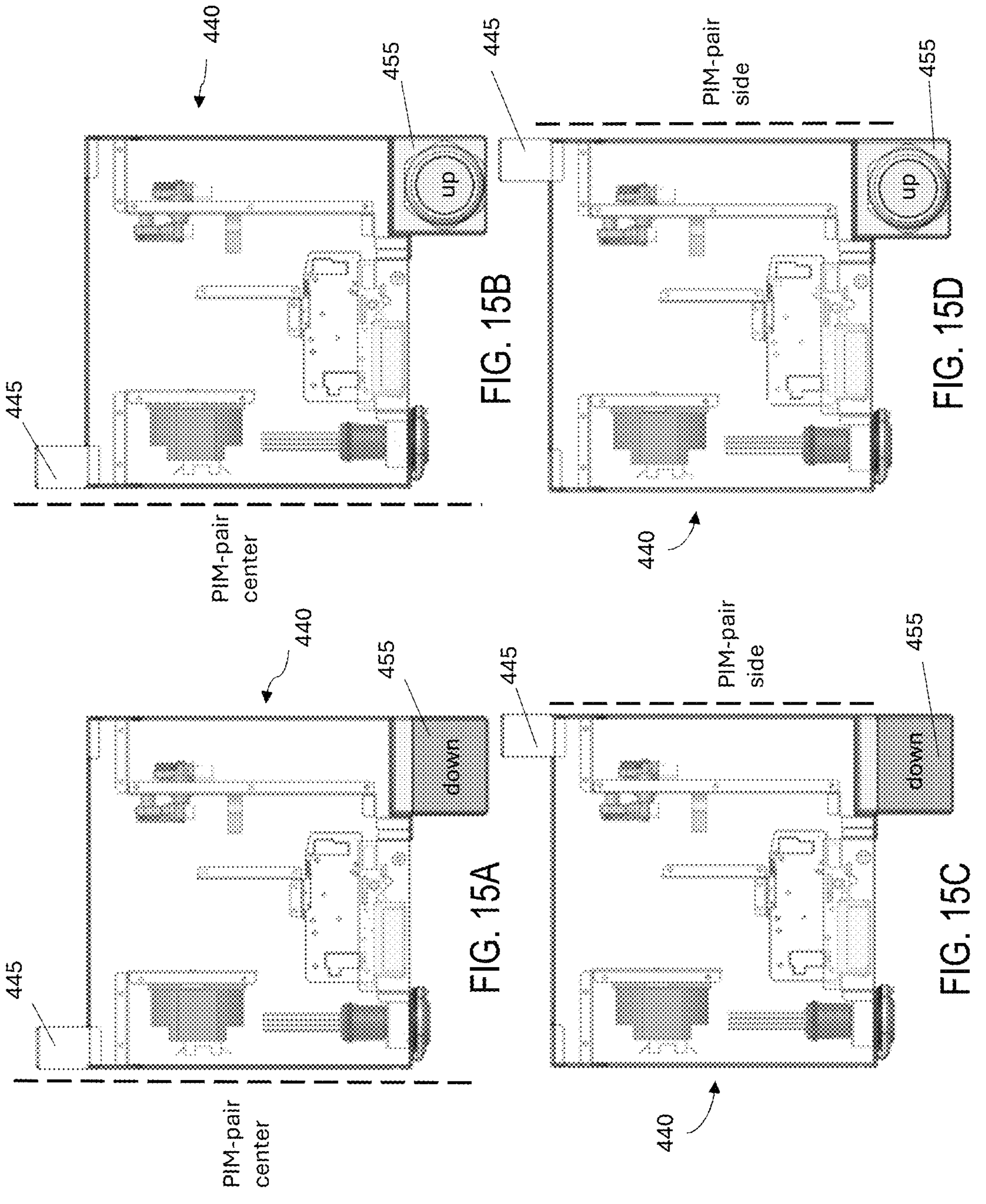
FIGS. 15A-15D are top views illustrating a PIM installable in multiple installation configurations.
Figure 16:
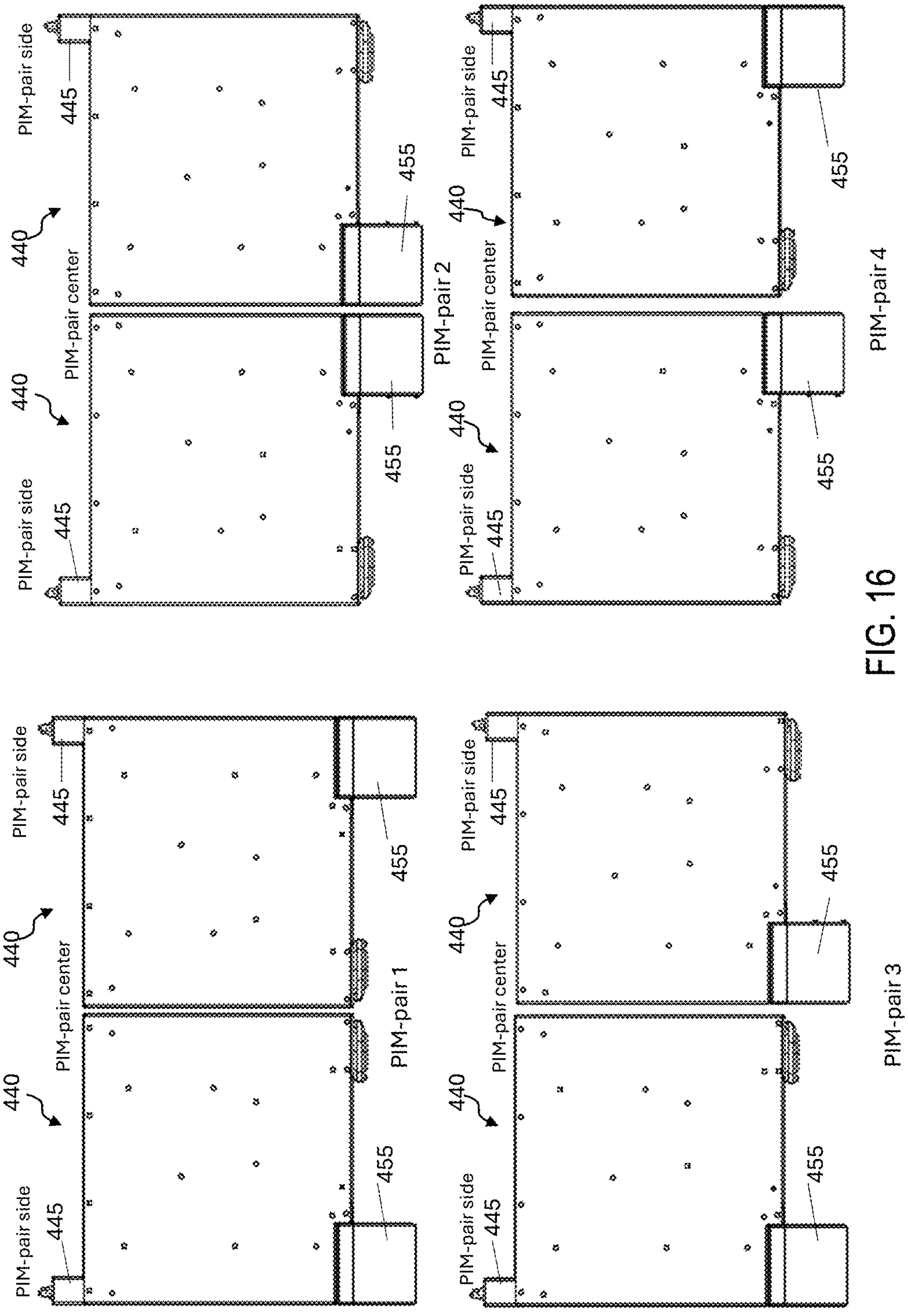
FIGS. 16-19 include top views illustrating PIM-pairs installable in multiple installation configurations.
Figure 17:
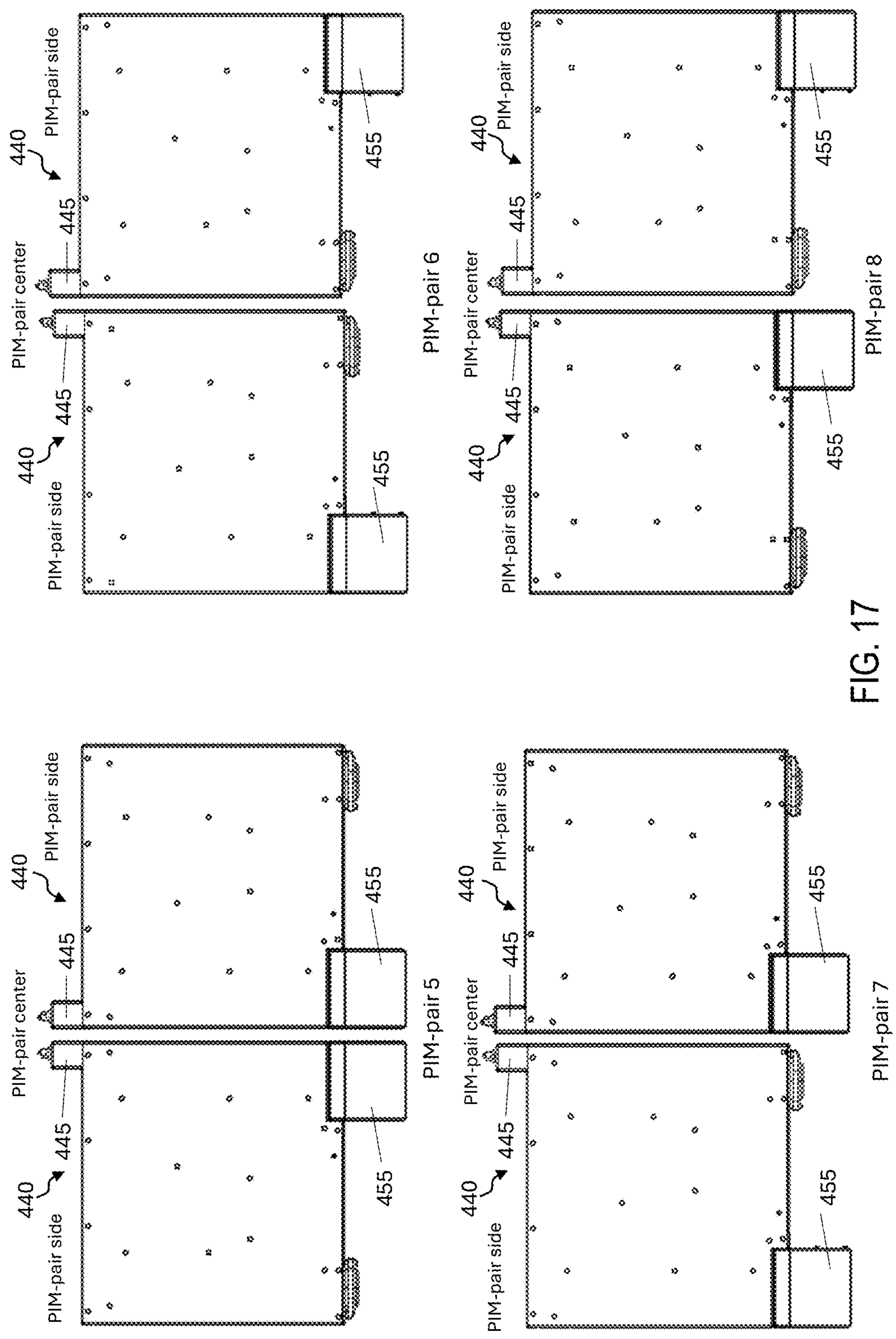
Figure 18:
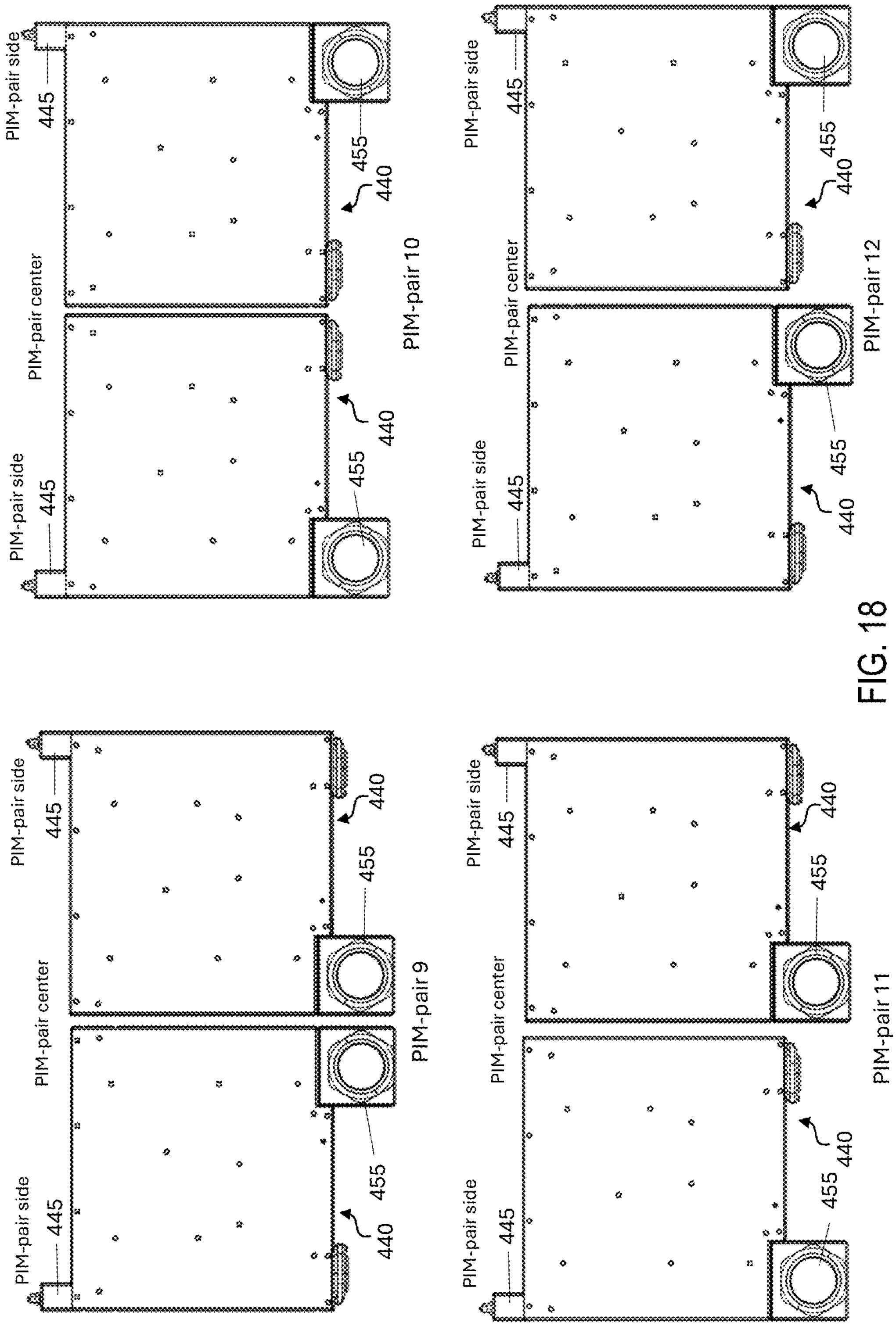
Figure 19:
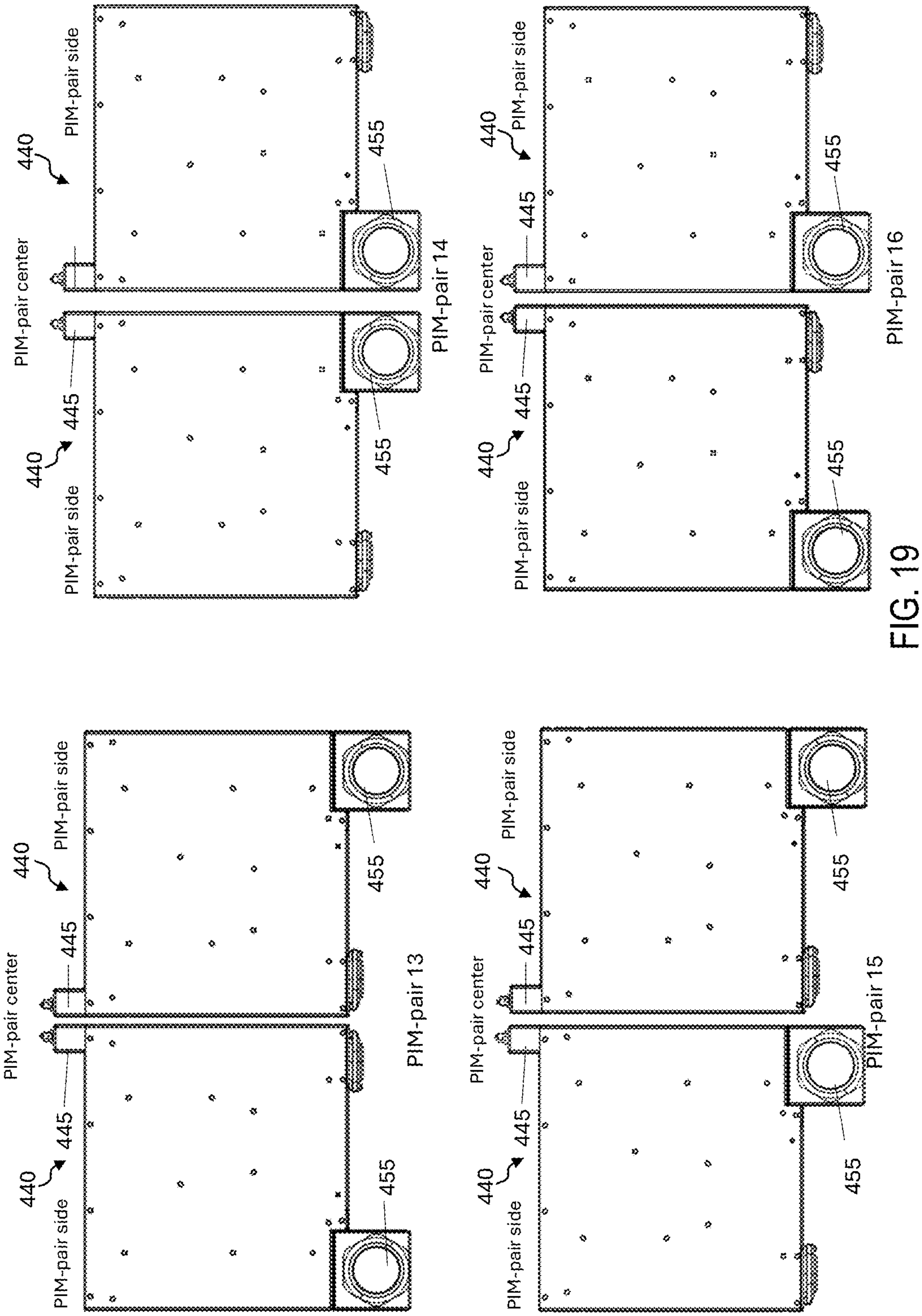

Based on the variable arrangements of the PIM 440 discussed above, there may be four different combinations of the input assembly 455 and the output assembly 445 to configure an individual PIM 440. FIG. 15A shows the input assembly 455 facing down and the output assembly 445 at the PIM-pair center. FIG. 15B shows the input assembly 455 facing up and the output assembly 445 at the PIM-pair center. FIG. 15C shows the input assembly 455 facing down and the output assembly 445 at the PIM-pair side, and FIG. 15D shows the input assembly 455 facing up and the output assembly 445 at the PIM-pair side.

In instances where the PIMs are installed in the rack in pairs, the four possible configurations illustrated in FIGS. 14A-D and FIGS. 15A-D produce numerous permutations, which provide installment and reconfiguration flexibility, depending on the rack arrangement encountered on-site. Some of the various permutations are shown in FIGS. 16-19.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a," "an," and "the" are intended to include the plural forms as well, unless the context indicates otherwise. Moreover, the terms "comprises," "comprising," "includes," and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}."

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An information processing system comprising:

a rack structure capable of accommodating one or more servers removably installed therein;

power distribution circuitry disposed in the rack structure and configured to provide power to the one or more servers; and a power input module (PIM) disposed in the rack structure and configured to receive input power from outside of the rack structure, convert the input power to output power, and convey the output power to the power distribution circuitry, wherein the PIM comprises:

power circuitry that is configured to convert the input power to the output power, a housing that houses the power circuitry and includes:

a fixed portion, an input assembly configured to route input feeds from outside of the rack structure into the PIM, the input feeds carrying the input power, and an output assembly comprising output feeds configured to supply the output power to the power distribution circuitry, wherein the input assembly and the output assembly are movable relative to the fixed portion of the housing.

2. The information processing system of claim 1, wherein the input assembly is capable of rotating 180 degrees relative to the fixed portion of the housing.

3. The information processing system of claim 2, wherein the input assembly comprises an opening configured to route the input feeds into the PIM, and wherein the rotation of the input assembly relative to the fixed portion of the housing changes a direction along which the input feeds extend into the input assembly through the opening of the input assembly by 180 degrees.

4. The information processing system of claim 3, wherein the rack structure is configured to be disposed on a support platform comprising one or more openings, and wherein the movability of the input assembly and the output assembly relative to the fixed portion of the housing allows the PIM to be reconfigured such that the input assembly is positioned over one of the openings in the support platform.

5. The information processing system of claim 4, wherein the one or more openings of the support platform are configured to route the input feeds through the rack structure into the PIM, and wherein the position of the opening of the input assembly is configured to interface the one or more openings of the support platform.

6. The information processing system of claim 1, wherein the output assembly is capable of relocating relative to the fixed portion of the housing.

7. The information processing system of claim 6, wherein the housing comprises a back panel and the output assembly is attached to the back panel, and wherein the output assembly is configured to relocate relative to the fixed portion of the housing by rotating the back panel respective to the fixed portion of the housing.

8. The information processing system of claim 6, wherein the housing comprises a filler cover located on an opposite end of the housing from the output assembly, and wherein the output assembly is configured to relocate relative to the fixed portion of the housing by swapping positions with the filler cover.

9. The information processing system of claim 6, wherein the output assembly comprises an electrical connector comprising the output feeds and configured to removably mate with a complimentary electrical connector of the power distribution circuitry and convey the output power to the power distribution circuitry.

10. The information processing system of claim 9, wherein the output assembly is movable relative to the fixed portion of the housing between two configurations including a first configuration in which the electrical connector is disposed adjacent a first side of the housing and a second configuration in which the electrical connector is disposed adjacent a second side of the housing.

11. The information processing system of claim 9, wherein the power distribution circuitry comprises one or more bus bars, and wherein a position of the electrical connector of the output assembly is determined based on a position of the one or more bus bars relative to the PIM.

12. An information processing system comprising:

a rack structure capable of accommodating one or more servers removably installed therein;

power distribution circuitry disposed in the rack structure and configured to provide power to the one or more servers; and a pair of power input modules (PIM-pair) disposed in the rack structure and configured to receive input power from outside of the rack structure, convert the input power to output power, and convey the output power to the power distribution circuitry, wherein the PIM-pair comprises:

power circuitry that is configured to convert the input power to the output power, a corresponding pair of housings that house the power circuitry, wherein each housing includes a fixed portion, a corresponding pair of input assemblies configured to route input feeds from outside of the rack structure into the PIM-pair, the input feeds carrying the input power, and a corresponding pair of output assemblies comprising output feeds configured to supply the output power to the power distribution circuitry, wherein each input assembly and each output assembly are movable relative to the fixed portion of each corresponding housing.

13. The information processing system of claim 12, wherein the PIM-pair includes a center of the PIM-pair and sides of the PIM-pair, and wherein the center of the PIM-pair is located at an interface between the power input modules, and the sides of the PIM-pair are located on opposite sides of the center of the PIM-pair for each of the power input modules.

14. The information processing system of claim 13, wherein each input assembly is capable of rotating 180 degrees relative to the fixed portion of a respective housing of the corresponding pair of housings.

15. The information processing system of claim 14, wherein each input assembly comprises a corresponding opening configured to route the input feeds into the PIM-pair, and wherein the rotation of each input assembly relative to the fixed portion of the respective housing changes a direction along which the input feeds extend into the corresponding pair of input assemblies through the corresponding opening of each input assembly by 180 degrees.

16. The information processing system of claim 13, wherein each input assembly is located either in the center of the PIM-pair, or on one of the sides of the PIM-pair.

17. The information processing system of claim 12, wherein each output assembly is capable of relocating relative to the fixed portion of a respective housing of the corresponding pair of housings.

18. The information processing system of claim 17, wherein each housing of the corresponding pair of housings comprises a back panel and each output assembly is attached to the back panel of the respective housing, and wherein each output assembly is configured to relocate relative to the fixed portion of the respective housing by rotating the back panel respective to the fixed portion of the respective housing.

19. The information processing system of claim 18, wherein each output assembly comprises an electrical connector comprising the output feeds and configured to removably mate with a complimentary electrical connector of the power distribution circuitry and convey the output power to the power distribution circuitry, and wherein each output assembly is movable relative to the fixed portion of the respective housing between two configurations including a first configuration in which the electrical connector is disposed adjacent a first side of the respective housing and a second configuration in which the electrical connector is disposed adjacent a second side of the respective housing.

20. A power input module (PIM) for a server rack, comprising:

a housing configured to be installed in the server rack, the housing comprising a fixed portion, an input assembly coupled to the fixed portion and configured to receive and route power input feeds from outside the server rack into the PIM, and an output assembly coupled to the fixed portion and comprising an output connector configured to connect with and supply power to power distribution circuitry of the server rack; and power circuitry housed within the housing and configured to convey power from the power input feeds to the output connector, wherein each of the input assembly and the output assembly is independently movable relative to the fixed portion of the housing between at least two configurations.

* * * * *